United States Patent
Laroia et al.

(10) Patent No.: US 7,405,686 B2
(45) Date of Patent: Jul. 29, 2008

(54) METHODS AND APPARATUS FOR IMPLEMENTING AND/OR USING AMPLIFIERS AND/OR FOR PERFORMING VARIOUS AMPLIFICATION RELATED OPERATIONS

(75) Inventors: Rajiv Laroia, Basking Ridge, NJ (US); Tom Richardson, South Orange, NJ (US); Frank A. Lane, Asbury, NJ (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 11/477,149

(22) Filed: Jun. 27, 2006

(65) Prior Publication Data

US 2006/0290549 A1 Dec. 28, 2006

Related U.S. Application Data

(60) Provisional application No. 60/694,549, filed on Jun. 27, 2005.

(51) Int. Cl.
  *H03M 3/00* (2006.01)
  *H03M 1/06* (2006.01)
(52) U.S. Cl. ...................................... 341/143; 341/118
(58) Field of Classification Search ................. 341/144, 341/155, 143, 118, 120; 375/297; 455/436, 455/115.1, 130; 330/10, 251, 207
See application file for complete search history.

(56) References Cited

U.S. PATENT DOCUMENTS

| 5,410,592 | A | 4/1995 | Wagner | 379/388.3 |
|---|---|---|---|---|
| 5,974,089 | A | 10/1999 | Tripathi et al. | |
| 6,150,969 | A | 11/2000 | Melanson | |
| 6,344,811 | B1 | 2/2002 | Melanson | |
| 6,351,229 | B1 * | 2/2002 | Wang | 341/143 |
| 6,373,334 | B1 | 4/2002 | Melanson | |
| 6,515,604 | B2 | 2/2003 | Delano | |

(Continued)

FOREIGN PATENT DOCUMENTS

JP 63 0441777 2/1988
WO WO 01/97384 A2 12/2001

OTHER PUBLICATIONS

Sakane F. T. et al "Two-Bit Instantaneously Adaptive Delta Modulation for P.C.M. Encoding" Radio and Electronic Engineer, Institution of Electronic and Radio Engineers., London, GB, vol. 48 No. 4, Apr. 1978 pp. 187-197, XP009002897 ISSN.: 0003-7722.

(Continued)

*Primary Examiner*—Peguy JeanPierre
(74) *Attorney, Agent, or Firm*—Michael P. Straub; William Marcus Hooks; Thomas R. Rouse

(57) ABSTRACT

Methods and apparatus for implementing and/or using amplifiers and performing various amplification related operations are described. The methods are well suited for use with, but not limited to, switching type amplifiers. The methods and apparatus described herein allow for the use of switching amplifiers while reducing and/or compensating for distortions that the use of such amplifiers would normally create. The described methods and apparatus can be used alone or in combination with various novel signaling schemes which can make it easier to compensate for the non-ideal behavior of switching amplifiers in such a way as to enable practical application in wireless transmission and/or other applications.

47 Claims, 28 Drawing Sheets

Simple First Order DeltaSigma

U.S. PATENT DOCUMENTS

| | | | |
|---|---|---|---|
| 6,646,502 B1 | 11/2003 | Kruiskamp | 330/10 |
| 6,741,123 B1 | 5/2004 | Andersen et al. | |
| 6,768,779 B1 * | 7/2004 | Nielsen | 375/297 |
| 6,795,005 B2 | 9/2004 | Hochschild | |
| 6,795,693 B2 * | 9/2004 | Balech | 455/115.1 |
| 6,819,275 B2 | 11/2004 | Reefman et al. | |
| 6,836,231 B2 | 12/2004 | Pearson | |
| 6,856,194 B2 | 2/2005 | Nilsson et al. | |
| 6,937,175 B1 | 8/2005 | Cruz-Albrecht et al. | |
| 6,967,607 B2 | 11/2005 | Melanson | |
| 6,970,503 B1 | 11/2005 | Kalb | |
| 7,058,464 B2 | 6/2006 | Mallinson | |
| 7,084,799 B1 | 8/2006 | Butler | |
| 7,200,399 B2 * | 4/2007 | Gallagher et al. | 455/436 |
| 2004/0046680 A1 | 3/2004 | Masuda | 341/143 |
| 2004/0066228 A1 | 4/2004 | Lennartson et al. | |
| 2004/0131193 A1 | 7/2004 | Kitamura | |
| 2006/0091945 A1 * | 5/2006 | Wegner | 330/10 |

OTHER PUBLICATIONS

Jantzi S. A. et al "The Effects of Mismatch in Complex Bandpass Delta-Sigma Modulators" 1996 IEEE International Symposium on Circuits and Systems (ISCAS). Circuits and Systems Connecting the World. Atlanta, May 12-15, 1996 IEEE International Symposium on Circuits and Systems (ISCAS), New York, IEEE, U.S. vol. 1, 12, May 1996, pp. 227-230, XP000825555 ISBN: 0-7803-3074-9.

Ramesh M.C. et al: "Sigma delta analog to digital converters with adaptive quantization" Circuits and Systems, 1997. Proceedings of the 40th Midwest Symposium on Sacramento, CA. USA, Aug. 3-6, 1997, New York, NY USA, IEEE, US, Aug. 3, 1997 pp. 22-25, XP010272481, ISBN: 0-7803-3694-1.

Jantzi Stephen A. et al: "Quadrature Bandpass Modulation for Digital Radio" IEEE Journal of Solid-State Circuits, IEEE Service Center, Piscataway, NJ, US, vol. 32, No. 12, Dec. 1997 XP011060622 ISSN: 0018-9200.

Midya P. et al. "Prediction Correction Algorithm for Natural Pulse Width Modulation" Proceedings of the International AES Conference, Sep. 22, 2000, pp. 1-20 4 pgs XP009008487.

Frederick H. Raab et al: "Power Amplifiers and Transmitters for RF and Microwave", IEEE Transactions on Microwave Theory and Techniques, IEEE Service Center, Piscataway, NJ., US, vol. 50, No. 3, Mar. 2002, XP011038657, ISSN: 0018-9480.

Ketola J. et al: "Transmitter utilising bandpass delta-sigma modulator and switching mode power amplifier", Circuits and Systems, 2004. ISCAS '04. Proceedings of the 2004 International Symposium on Vancouver, BC, Canada, May 23-26, 2004, Piscataway, NJ, USA, IEEE, US, May 23, 2004 pp. 1-633, XP010719195, ISBN: 0-7803-8251-X.

Dupuy A. et al: "High efficiency power transmitter based on envelope delta-sigma modulation (EDSM)" Vehicular Technology Conference, 2004. VTC2004-Fall, 2004 IEEE 60th Los Angeles, CA, USA Sep. 26-29, 2004, Piscataway, NJ, USA, IEEE, Sep. 26, 2004 pp. 2092-2095, XP010787008, ISBN: 0-7803-8521-7.

The International Search Report, pp. 1-7 dated Jan. 2, 2007 from PCT application No. PCT/US2006/025211.

Written Opinion Of The International Searching Authority, pp. 1-11 dated Jan. 2, 2007 from PCT application No. PCT/US2006/025211.

* cited by examiner

Simple First Order DeltaSigma

General form for DeltaSigma

Frequency Shifting Complex DeltaSigma

Representative circuit form

Concept of DeltaSigma Correction

Correction Calculation

Basic compensator in the DeltaSigma modulator

Direct Modulation Scheme

Real Form of Direct Modulation Scheme

Re-ordered Real Form of Direct Modulation Scheme

Exemplary Waveforms from Reordered Real Form of Direct Modulation Scheme

Time Varying Quantizer Form

Four Phase carrier clock implementation of Direct Modulation Scheme

An alternate frequency shifting DeltaSigma form

Equivalent First Stage

Modulated single clock form

Modulated Q

Possible Decision Region for q=5

Six and Eleven point constellations, with and without nearest pairs

Constellation for eight times carrier clock

Receiver based calibration

Thevenin equivalent

Thevenin quivalent with Load

METHODS AND APPARATUS FOR IMPLEMENTING AND/OR USING AMPLIFIERS AND/OR FOR PERFORMING VARIOUS AMPLIFICATION RELATED OPERATIONS

RELATED APPLICATIONS

The present application claims the benefit of U.S. Provisional Patent Application Ser. No. 60/694,549, filed on Jun. 27, 2005, titled "METHODS AND APPARATUS FOR IMPLEMENTING AND/OR USING AMPLIFIERS AND/OR FOR PERFORMING VARIOUS AMPLIFICATION RELATED OPERATIONS", which is hereby expressly incorporated by reference.

FIELD OF THE INVENTION

The present invention relates to amplifier methods and apparatus and, more particularly, to methods and apparatus for implementing and/or using amplifiers and/or for performing various amplification related operations.

BACKGROUND

Delta Sigma (ΔΣ) modulators are devices for causally computing a discrete valued (often two-valued) digital approximation or near representation of an analog or virtually continuous valued digital signal. The representation is typically a high rate (e.g., high clock rate) signal quantized to a small number of discrete levels (e.g., two). ΔΣ modulators are often used in analog-to-digital conversion and also in digital-to-analog conversion. ΔΣ modulators that produce two level representations are good candidates for use in conjunction with switching amplifiers because such amplifiers have essentially two power efficient states and operate by switching between the states.

While the use of Delta Sigma modulators as part of a power amplification device has been tried for some high frequency applications, e.g., RF applications, the use of Delta Sigma modulators has generally been limited due to the signal distortions introduced by the known implementations. While the use of high accuracy, and thus high cost, switching components can help reduce the amount of distortions as compared to implementations which use lower cost components, the distortions introduced by known Delta Sigma modulator based amplifers still remains too high for many applications particularly wireless communications applications where the power efficiency advantages of Delta Sigma modulator based amplifiers would be particularly desirable.

In view of the above discussion, it should be appreciated that there is a general need for improved ways of performing amplification and implementing amplification devices. With regard to Delta Sigma modulators, while amplifiers which use Delta Sigma modulators are known, there is a need for improved methods and apparatus which allow for the use of Delta Sigma modulators in amplification devices. Accordingly, there is a need for improved methods and apparatus for implementing amplifiers which use Delta Sigma modulators. In view of the distortion issues associated with the use of Delta Sigma modulators in power amplifiers, it would be beneficial if ways of reducing, compensating or eliminating distortions introduced into a signal as the result of using a Delta Sigma modulator could be developed. While some improvements may be directed to improved circuitry or apparatus, other improvements may be directed to the signals which are processed by Delta Sigma modulators or ways in which a power amplifier using a Delta Sigma modulator is controlled.

SUMMARY

Methods and apparatus for implementing and/or using amplifiers and performing various amplification related operations are described. The methods are well suited for use with, but not limited to, switching type amplifiers. Various methods and apparatus of the invention can be used to perform power amplification operations, e.g., using one or more S-type or D-type amplifiers.

The described methods and apparatus can be used in a wide range of applications. Various embodiments are well suited for wireless transmission applications, e.g., in a base station or wireless terminal. Other embodiments are well suited for audio and other applications where an amplifier is used. The methods and apparatus are not limited to these applications but can be used in other applications as well.

Power efficiency can be important in amplifiers for transmitters yet stringent linearity requirements often render the amplifiers very inefficient, on the order of 5 to 10 percent for wireless base-stations in many existing systems. Switching amplifiers can be very power efficient but are normally not used for wireless applications because, in known systems, the high frequency signals used in wireless applications can not be sufficiently accurately reproduced using switching amplifiers.

The methods and apparatus described herein allow for the use of switching amplifiers while reducing and/or compensating for distortions that the use of such amplifiers would normally create. The described methods and apparatus can be used alone or in combination with various novel signaling schemes which can make it easier to compensate for the non-ideal behavior of switching amplifiers in such a way as to enable practical application in wireless transmission and/or other applications.

The fidelity of switching type amplifiers can be improved using the described methods and/or apparatus, so that such amplifiers can, in some form, be applied to a wide variety of applications where power amplifiers are used, including, e.g., audio applications.

While various embodiments have been discussed in the summary above, it should be appreciated that not necessarily all embodiments include the same features and some of the features described above are not necessary but can be desirable in some embodiments. Numerous additional features, embodiments and benefits of various embodiments are discussed in the detailed description which follows.

DETAILED DESCRIPTION

To gain an understanding of the various features and benefits of the invention, an understanding of Delta Sigma modulators and their effects, alone and in combination with switching type amplifiers, is useful.

2.1 Signal Representation via Sigma Delta.

A smooth real valued function f taking values in the range $[-1,1]$ can be "weakly" approximated arbitrarily accurately by a function $\tilde{f}$ taking only the values $\pm 1$. "Weak" approximation means that for any suitable smooth function g the integral $\int (f(x)-\tilde{f}(x))g(x)$ will be relatively small in magnitude.

$\Delta\Sigma$ modulation applies the same principle. A low-pass (e.g., smooth) signal U of bandwidth $2W_B$HZ is approximated by a discrete signal V with clock frequency $f_c=(OSR)W_B$ where OSR is an Over-Sampling-Ratio. For purposes of explanation, the discrete valued signal can be thought of as a discrete valued function (e.g., two valued) changing value only on clock boundaries or as a series of discretely scaled $\delta$ functions, possibly convolved with a square pulse.

$\Delta\Sigma$ can be applied to both continuous-time and discrete-time signals. We shall focus primarily on discrete-time signals which may be produced by sample-and-hold operations applied to a continuous-time signal.

Figure 1:
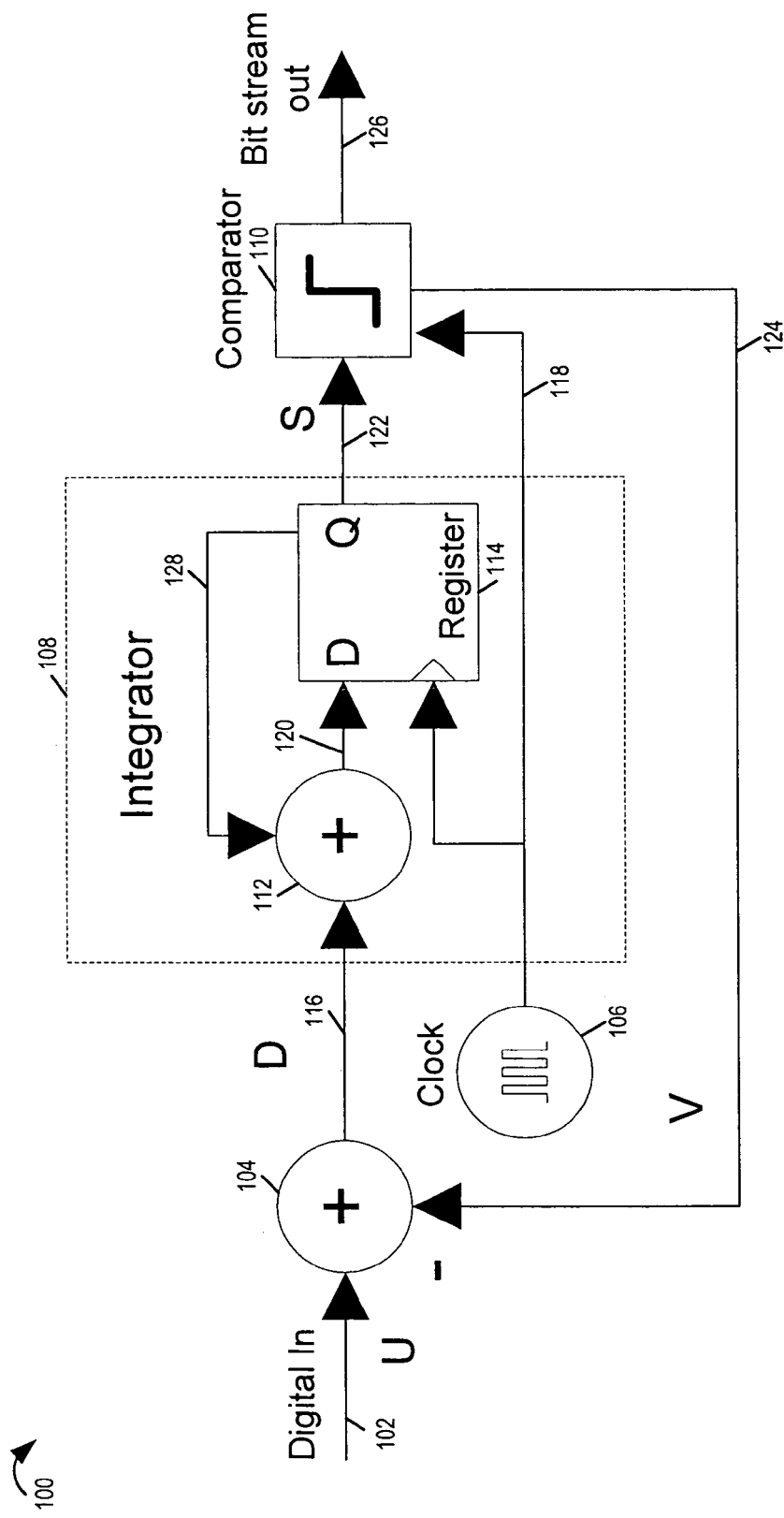
FIG. 1 is a drawing of an exemplary simple first order Delta-Sigma modulator in accordance with various embodiments.

A simple $\Delta\Sigma$ modulator 100 for a discrete-time signal U 102 is depicted in FIG. 1. Exemplary $\Delta\Sigma$ modulator 100 includes an adder 104, a clock 106, an integrator 108 and a comparator 110 coupled together as shown in FIG. 1. Integrator 108 includes an adder 112 and a register 114. In each clock cycle register 114 saves the digital output of adder 112. The inputs to the adder 112 are the previously stored value in the register 128 and the difference signal D 116. Thus, the output of the adder 112, which is stored in the register as S 122, is the integral (time sum) of the difference signal D 116. A comparator 110 (1 bit in this example), or quantizer, quantizes the signal S 122, e.g., according to its sign, to e.g. $\pm 1$. This signal may be scaled to some other value, e.g., $\pm A$ to produce the approximation V 124. For simplicity we will assume unity scaling, absorbing it into the quantizer. Thus, the signal S 122 is the time integral of U–V and the quantizer chooses a value to try to reduce the magnitude of this integral. The circuit therefore tries to construct V 124 so as to locally minimize.

$$\int_0^T (U-V).$$

Looking at the Fourier transforms of U and V we see that the circuit attempts to keep $$\frac{1}{i\omega}(\hat{U}(\omega)-\hat{V}(\omega))$$

small where $$\hat{U}(w):=\int_{-\infty}^{\infty} e^{-j\omega t} U(t) dt.$$

Thus $\hat{V}(\omega)$ approximates $\hat{U}(\omega)$ for small values of $\omega$.

Figure 2:
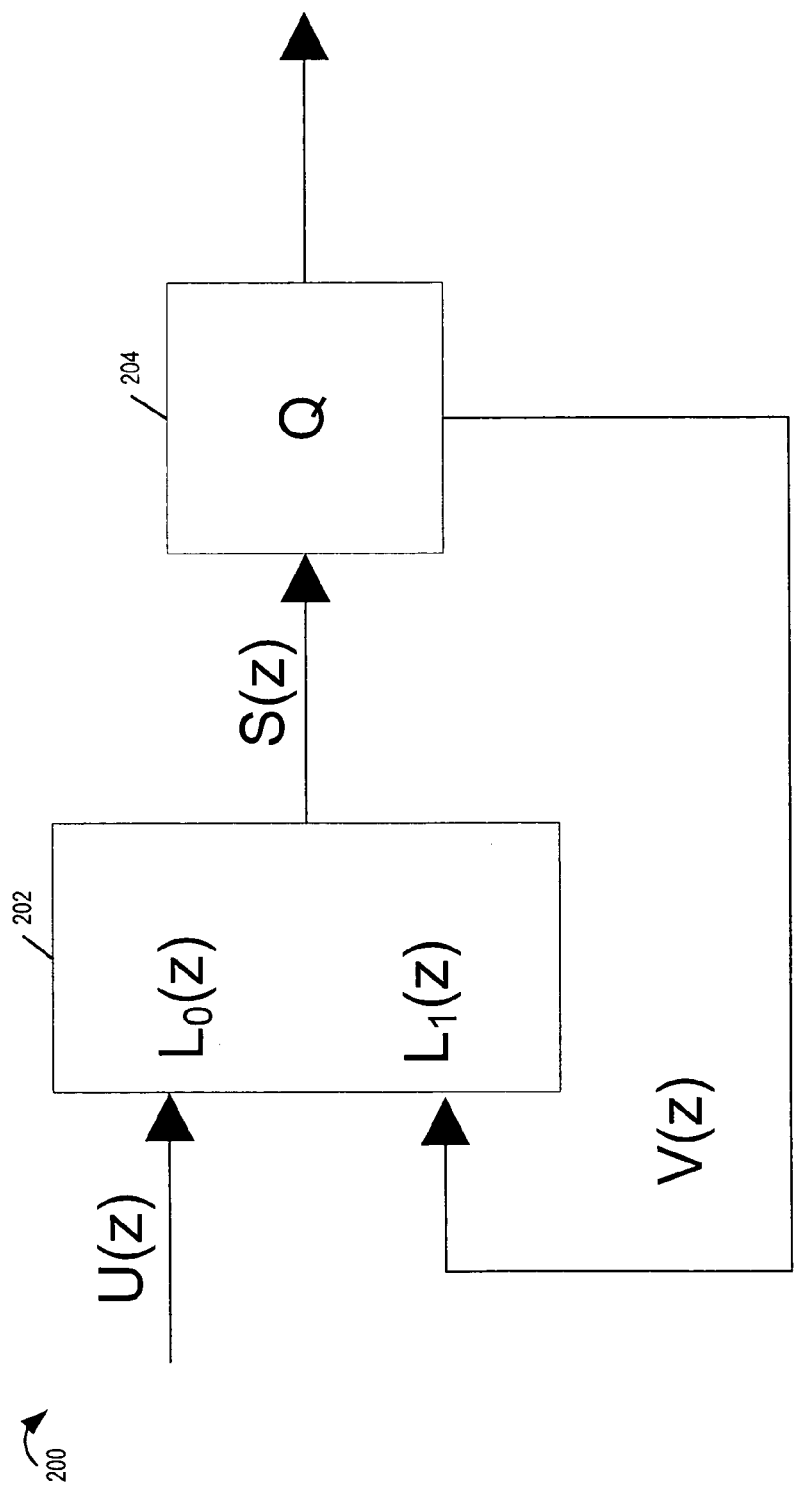
FIG. 2 is a drawing of an exemplary form for a DeltaSigma modulator in accordance with various embodiments.

The basic idea above can be generalized in several ways, to higher order (more than one integral), more general error functionals (combining different integrals) and multi-level quantizers, etc. A more general form is depicted in drawing 200 of FIG. 2. FIG. 2 includes a linear transform function module 202 and a quantizer module 204 coupled together as shown. The linear transform function module 202 receives inputs U(z) and V(z), performs linear operations, and generates output S(z). Quantizer module 204 receives S(z) as input and outputs V(z). Here $$S(z)=U(z)L_0(z)+V(z)L_1(z)$$

and $$V(z)=S(z)+E(z)$$

where E(z) represents the quantization noise, and $$V(z) = \frac{L_0(z)}{1-L_1(z)}U(z) + \frac{1}{1-L_1(z)}E(z)$$

where z represents unit delay as in standard z-transform.

The system can also be expressed in state space form $$S_t = CX_t + D_U U_t$$

$$X_{t+1} = AX_t + B_U U_t + B_V V_t$$

$$V_t = S_t + E_t$$

where the dimension of X is the order of the modulator.

Figure 3:
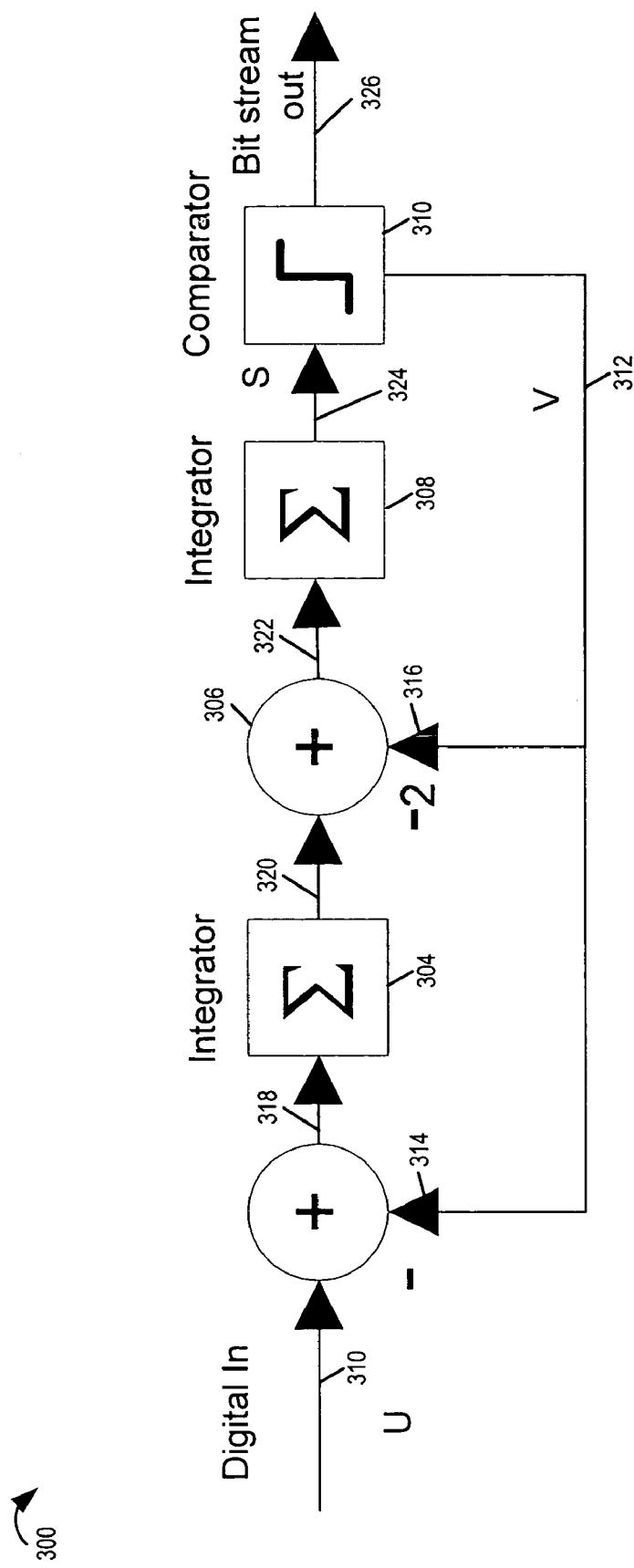
FIG. 3 is a drawing of an exemplary second order Delta-Sigma modulator in accordance with various embodiments.

For example, consider the system 300 shown in FIG. 3. Exemplary system 300 illustrates an exemplary second order DeltaSigma modulator. System 300 includes a first adder 302, a first integrator 304, a second adder 306, a second integrator 308, and a comparator 310 coupled together as shown in FIG. 3. The inputs to the first adder 302 are digital input U 310 and −V 314; the output of first adder 302 is signal 318. The input to first integrator 304 is signal 318, and the output of first integrator 304 is signal 320. The inputs to second adder 306 are signal 320 and −2V 316. The output of second adder 306 is signal 322 which is the input to $2^{nd}$ integrator 308. The output of $2^{nd}$ integrator 308 is signal S 324 which is an input to comparator 310. The output of comparator 310 is bit stream output signal 326 and signal V. Here, $$X^1_{T+1} = \sum_{t=0}^{T}(U_t - V_t) = X^1_T + (U_T - V_T)$$

$$X^2_{T+1} = X^2_T + X^1_T - 2V_T$$

In this case we have $$X_{t+1} = \begin{bmatrix} 1 & 0 \\ 1 & 1 \end{bmatrix} X_t - \begin{bmatrix} 1 \\ 2 \end{bmatrix} V_t + \begin{bmatrix} 1 \\ 0 \end{bmatrix} U_t$$

and $$L_0(z) = \frac{z^{-2}}{(1-z^{-1})^2} \text{ and } L_1(z) = \frac{z^{-2} - 2z^{-1}}{(1-z^{-1})^2}.$$

2.2 Representation of Band-pass Signals.

A bandpass ΔΣ is possible and that the clock frequency can be a small factor (e.g., 4 or 8) times faster than the carrier frequency. The basic reason for this is that a filter can be used to ensure the in-band signal is passed while other signals are rejected and that modulation of the carrier, effectively a low-pass signal, is sampled at a high rate, high enough to also recover carrier phase.

The present invention exploits this basic principle. In accordance with the invention, a baseband signal is converted using a ΔΣ modulator and the result is a bandpass RF signal.

A standard mathematical representation for RF signals is $$\text{Re}(u(t)e^{j2\pi f_c t})$$

where u(t) is the complex baseband signal and $f_c$ is the carrier frequency. Typically the bandwidth of u(t) is much smaller than $f_c$. For example, u(t) might have a bandwidth of 5 MHz while $f_c$ might be 2 GHz. However, other frequencies are possible and the invention is not limited to these exemplary frequencies.

A passband RF signal can be converted to a binary representation using a ΔΣ modulator running at, e.g., 4 or $8f_c$. In many cases, it is undesirable to require such a fast sampling of the signal.

A simpler and more direct approach is to perform ΔΣ modulation on the baseband signal for I and Q components (real and imaginary parts) separately and then digitally modulate the combined result up to the carrier frequency. We will focus on some embodiments of the invention which use this approach beginning in Section 5.1 below.

3 Complex ΔΣ and RF Modulation

A complex baseband signal is typically separated into its real and imaginary parts (I and Q). ΔΣ modulation of the two signals can be done independently. For the purposes of the present invention, however, it may be more convenient to think of a single complex ΔΣ modulator. The summation of real and imaginary parts may occur independently, as in normal complex addition. The quantizer operates on a complex signal and the output may generally be viewed as a discrete complex signal. The quantizer may be effectively time varying. In the simplest case, where the quantizer quantizes real and imaginary parts independently, the complex ΔΣ modulator used in accordance with the invention may be, and in some embodiments is, simply two real ΔΣ modulators operating synchronously and in parallel.

The complex ΔΣ modulators will produce representations of complex baseband signals that ultimately will be modulated to RF frequencies. In some cases the RF representation is produced directly. Some of the techniques for doing this are central to the present invention. The structures we consider take as input a complex base-band signal and produce a two-valued real RF modulated approximation of that signal, with noise shaped to be mostly out-of-band. We will refer to such structures generally as frequency shifting ΔΣ.

Figure 4:
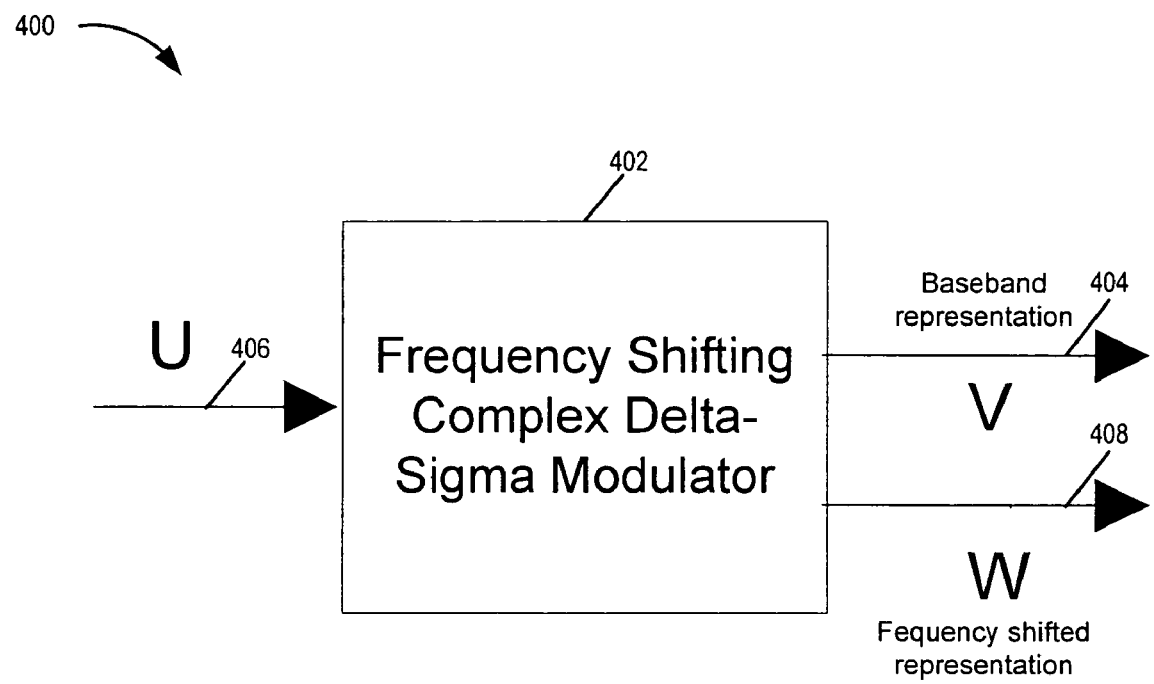
FIG. 4 is a drawing of an exemplary frequency shifting DeltaSigma modulator in accordance with various embodiments.

Drawing 400 of FIG. 4 illustrates the idea of a frequency shifting complex Delta-Sigma. A complex (base-band) ΔΣ 402 has an output V(baseband representation) 404 that is the discrete, complex, approximation to the input U 406. This signal 404 is used in a feedback path to measure its deviation from U 406, thereby controlling the ΔΣ 402 decisions. In the frequency shifting ΔΣ 402 the "true" output is W 408. This output W 408 represents a frequency shifted version of U 406. Often, W 408 will be a two-valued real signal. W 408 will typically be related to V 404 in a simple way and will be derivable from V 404. Thus, all information about W 408 is available in V 404, and vice-versa.

4 Correction for Switching Disturbance

Figure 5:
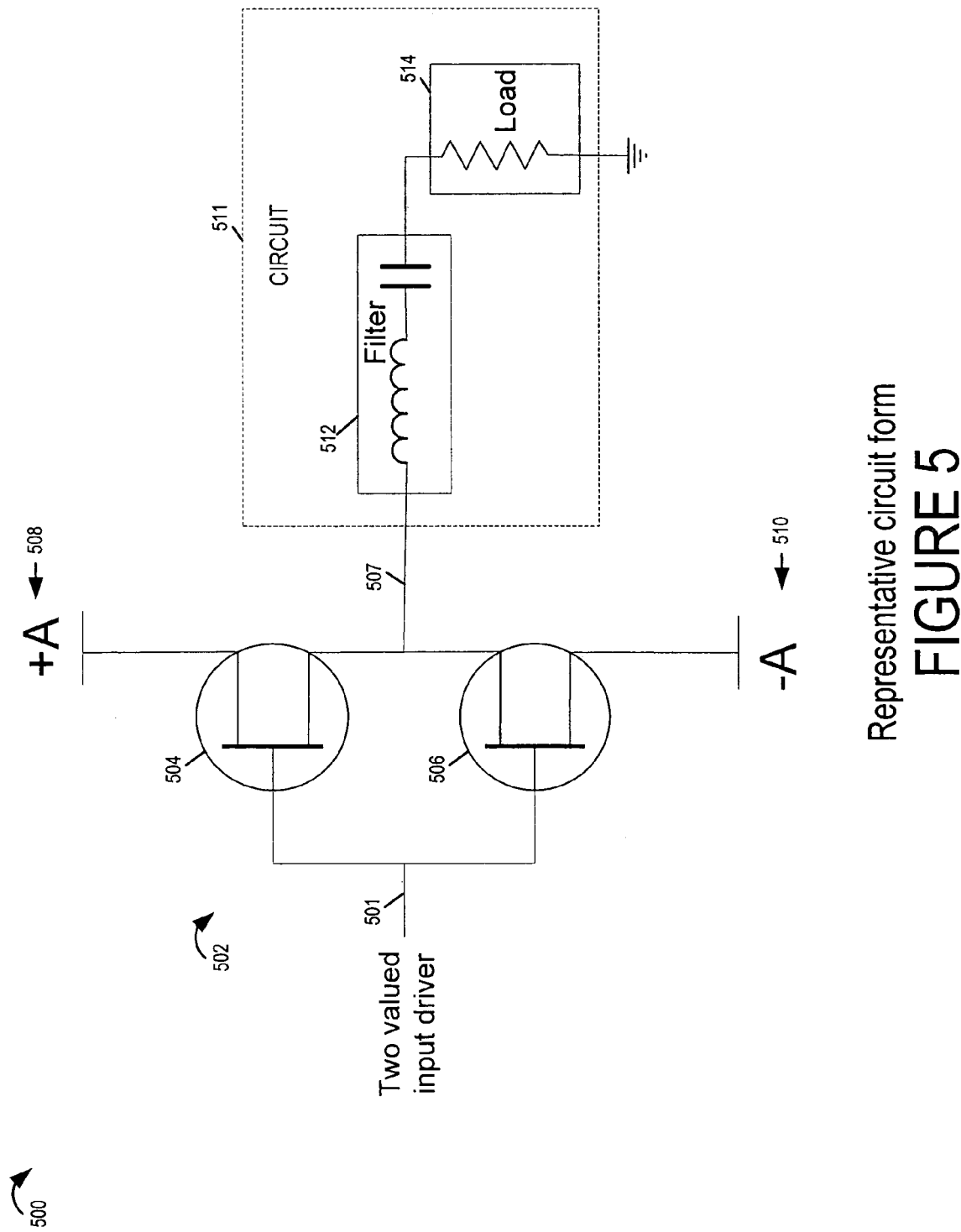
FIG. 5 is a drawing of a representative circuit form of an exemplary switching amplifier, filter and load, in accordance with various embodiments.

An application being addressed by this invention is power amplification, e.g., of bandpass RF signals or other signals. The signals 501 being produced by a frequency shifting ΔΣ modulator, are used in accordance with the invention to drive a (two-state) switching amplifier 502 as depicted in drawing 500 of FIG. 5. For example, the frequency shifting ΔΣ modulator producing signal 501 may be ΔΣ modulator 402 of FIG. 4 and signal 501 may be signal W 408. The switching unit 502, using e.g. high power FET transistors (504, 506), serves to connect the output 507 to a power supply with two voltage levels, here indicated as +A and −A (508, 510), respectively. The switching unit 502 drives a circuit 511 including a band-pass filter 512 followed by the load 514. The switching unit (SU) 502 of the amplifier cannot be expected to accurately reproduce the waveform with which it is driven, especially in a high-frequency high-power setting.

Figure 6:
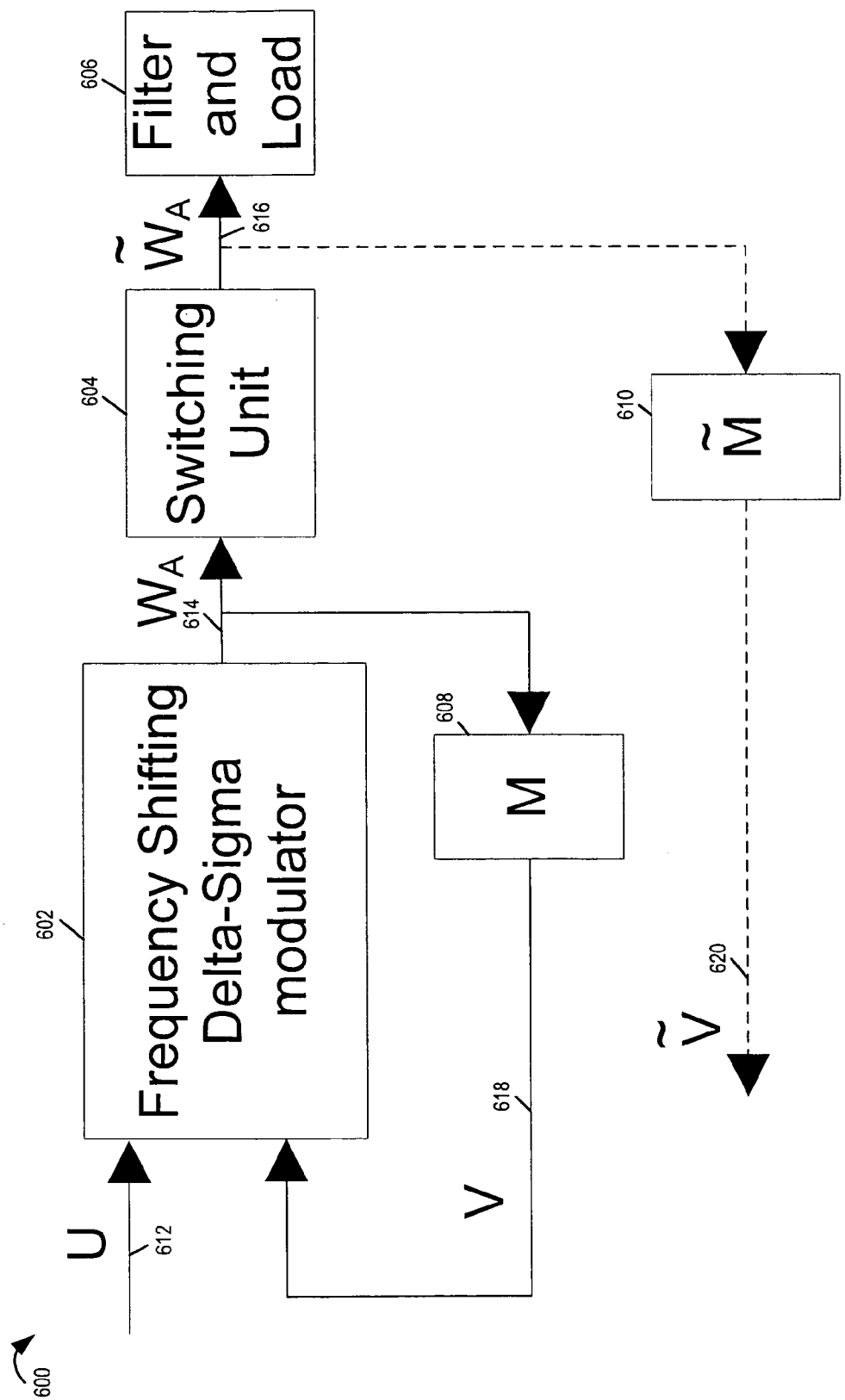
FIG. 6 is a drawing illustrating the concept of DeltaSigma correction in accordance with various embodiments.

Drawing 600 of FIG. 6 illustrates the concept of Delta-Sigma correction. For frequency shifting ΔΣ modulators, e.g., frequency shifting ΔΣ modulator 602 of FIG. 6, the signal W or $W_A$ 614, where $W_A$ 614 denotes an analog form of W suitable for driving the switching unit 604, determines V 618 and the relationship between the two is relatively straightforward. Here we let M 608 denote the map that gives V 618 from $W_A$. 614. In FIG. 6 we have illustrated the concept of ΔΣ correction for frequency shifting ΔΣ 602. The actual waveform delivered to the filter/load 606 will of course differ from $W_A$. 606. We denote the actual waveform by $\tilde{W}_A$. 616. Now, we imagine a map $\tilde{M}$ 610 that takes $\tilde{W}_A$ 616 to $\tilde{V}$ 620, such that if $\tilde{W}_A = W_A$ then $\tilde{V} = V$. The idea is that by replacing V with $\tilde{V}$ in the feedback path of the ΔΣ modulator 602, then $\tilde{V}$ would represent a frequency translated version of U 612. In other words, $\tilde{V}$ 620 would be a faithful base-band representation of $\tilde{W}_A$. 616. The function $\tilde{V}$ 620 can be assumed to be discrete-time with the same sample times as V 618 In such a case the values have been adjusted. The goal of the correction operation is to adjust the values of V 618 so as to properly produce $\tilde{V}$ 620 so that, in effect, the signal $\tilde{W}_A$ 616 represents the frequency shifted version of U 612. It is expected, and in many embodiments it is the case, that $W_A$ 614 will therefore no longer be a faithful representation of a frequency shifted U 612 but will, rather, represent a compensated version, compensation being in accordance with the invention for the non-ideal behavior of the switching unit or units, e.g., transistors.

Non-ideal behavior in switching amplifiers has many sources. These include limited slew rate, which may differ in the two switching directions, transient impedances, current dependent voltage drop, etc. A significant fraction of these effects arise during the switch between states. The distortion introduced by these effects therefore is exacerbated at high operating frequencies.

In accordance with the present invention, it is possible to model the non-ideal behavior of the power delivering circuit (e.g., power transistors) under various realistic conditions to analyze the effect on the signal, and to use the results to correct the driving signal by altering the state of the frequency shifting ΔΣ modulator. In other words, it is possible to correct V to more closely resemble $\tilde{V}$. In practice, this can be complicated but is possible when using the methods and/or apparatus of the present invention. In accordance with the present invention, it is possible to correct the internal state of the ΔΣ modulator.

One of the observations underlying the present invention is that a portion of the distortion of the waveform will depend on the current being delivered to the filter and load, especially during switching transitions. For band-pass RF signals the current to the load is proportional to real($u(t)e^{jw_ct}$), perhaps with some phase shift. A more detailed analysis is presented in the portion of this application under the subheading Analysis and Form of Compensation. In this discussion, u(t) is used to represent the base-band signal. In some cases, where the band-pass filter is not ideal for example, u(t) might be a filtered version of the input signal Thus, correction will be a function of recent transitions and the current base-band signal, or a filtered version of the base-band signal.

The switching unit is a physical device. Disturbances due to switching will decay over time. We can assume, however, that knowledge of the current and the input to the unit for some prior amount of time determines the output of the circuit to sufficient accuracy. The input to the circuit is determined by the output of the frequency shifting ΔΣ, whereas, assuming correct operation, the current is determined by the input signal. Because the bandwidth of the filter is small compared to the operating frequency, the memory of transitions is normally much smaller then the time scale over which envelope of the current to the filter can change significantly. Therefore, the correction to V to better approximate $\tilde{V}$ will be a function of a state including past discrete outputs of the ΔΣ modulator and the baseband input, or its filtered version.

Figure 7:
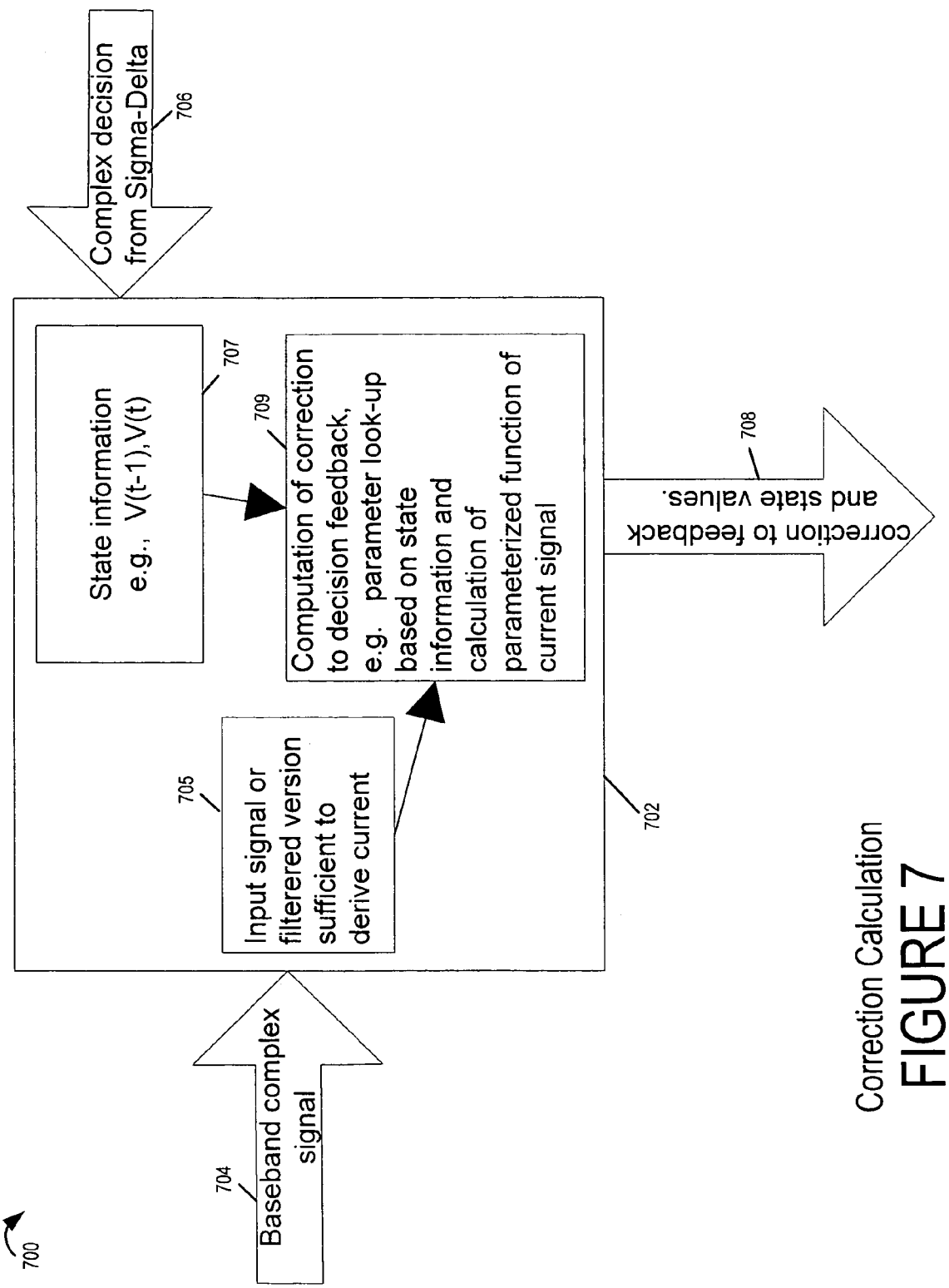
FIG. 7 is a drawing illustrating an exemplary correction calculation module and describing exemplary correction calculation in accordance with various embodiments.
Figure 8:
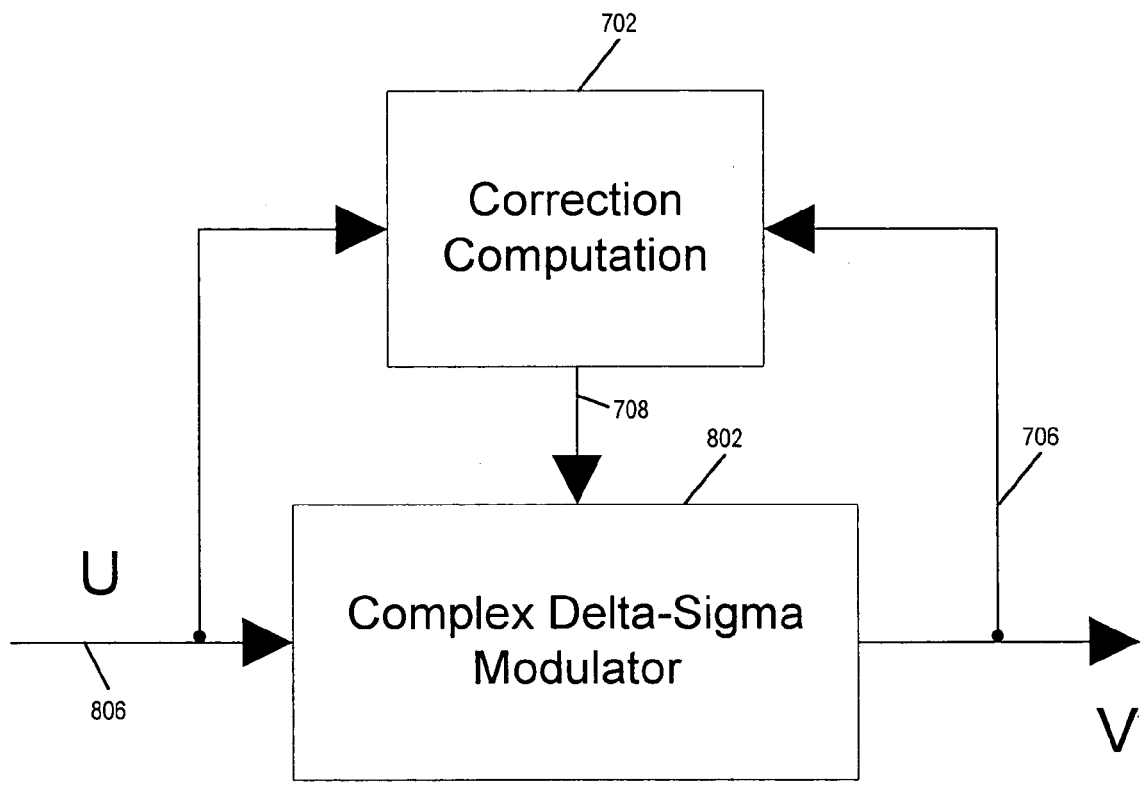
FIG. 8 is a drawing illustrating a correction computation module coupled to a complex Delta-Sigma modulator module in accordance with various embodiments.

FIG. 7 is a drawing 700 illustrating a correction computation module 702 which can be used in the system 800 shown in FIG. 8. FIGS. 7 and 8 illustrate the idea of a compensated ΔΣ circuit implemented in accordance with the invention. System 800 of FIG. 8 includes a complex Delta-Sigma Modulator 802 coupled to a correction computation module 702. Signal U 704 is a complex baseband signal which is input to both complex Delta-Sigma modulator 802 and correction computation module 702. Signal V 706 conveying complex decisions from Delta-Sigma, is output from Delta-Sigma Modulator 802 and used as input to correction module 702. Correction computation module 702 outputs correction signals 708, conveying correction to feedback and state values, which is input to complex delta-sigma modulator 802. In correction computation module 702, state information 707, e.g., V(t−1), V(t) is obtained from received signal 706. Input signal or a filtered version of the input signal sufficient to derive current 705 is obtained from complex baseband input signal 704. For example, information 705 is the information needed to decide the current that you want in a power amplifier for an ideal Delta-Sigma modulator. In sub-module 709, the correction computation module 702, performs a computation of correction to decision feedback, e.g., module 709 performs a parameter look-up based on state information 707 and a calculation of a parameterized function of current signal to determine a correction. Output correction signals 708 are input to the complex Delta-Sigma modulator 802. The compensator corrects the feedback term, representing the signal, to reflect the effects of the power amplifier. In general the correction will depend on some past window of ΔΣ output decisions and also the desired signal or a filtered version.

The compensator, e.g., correction computation module, uses and often stores, various parameters which can be learned from the operation of the amplifier. Some or all of the utilized parameters may be determined off-line in a calibration mode and/or programmed into the corrections computation module. In a general embodiment a current-dependent correction is represented as values of a function tabulated at many discrete points in a complex plane. The function is then evaluated by interpolation. A simpler alternative scheme that can be used in accordance with the invention uses a parameterized set of functions. Analysis by the inventors of the present application has shown that various low-order terms depending on the current can be sufficient, e.g. see Section 8. Other aspects of the current invention, including various frequency shifting ΔΣ schemes are designed to reduce the complexity of this calculation. We will address this issue in subsequent sections of this application.

In later sections of this application we show that it is reasonable to expect a term of the form $\alpha u + \beta u^*$ to arise from current dependent correction. We will refer to this term as the proportional term. One such term requires 4 real parameters, as indicated by the complex α and β coefficients. The number of such terms required depends on the number of distinct cases. Different transitions with different relevant history constitute different cases that may require distinct parameters. Many of the modulation schemes of the invention described in the following sections aim at minimizing the number of cases for which distinct parameters are used. We will generally consider the number of such cases as we develop the various modulation schemes.

Frequency Shifting ΔΣ

In this section we present various frequency shifting ΔΣ modulation schemes that can, and are, used in various embodiments of the invention.

5.1 Direct Modulation Scheme

Figure 9:
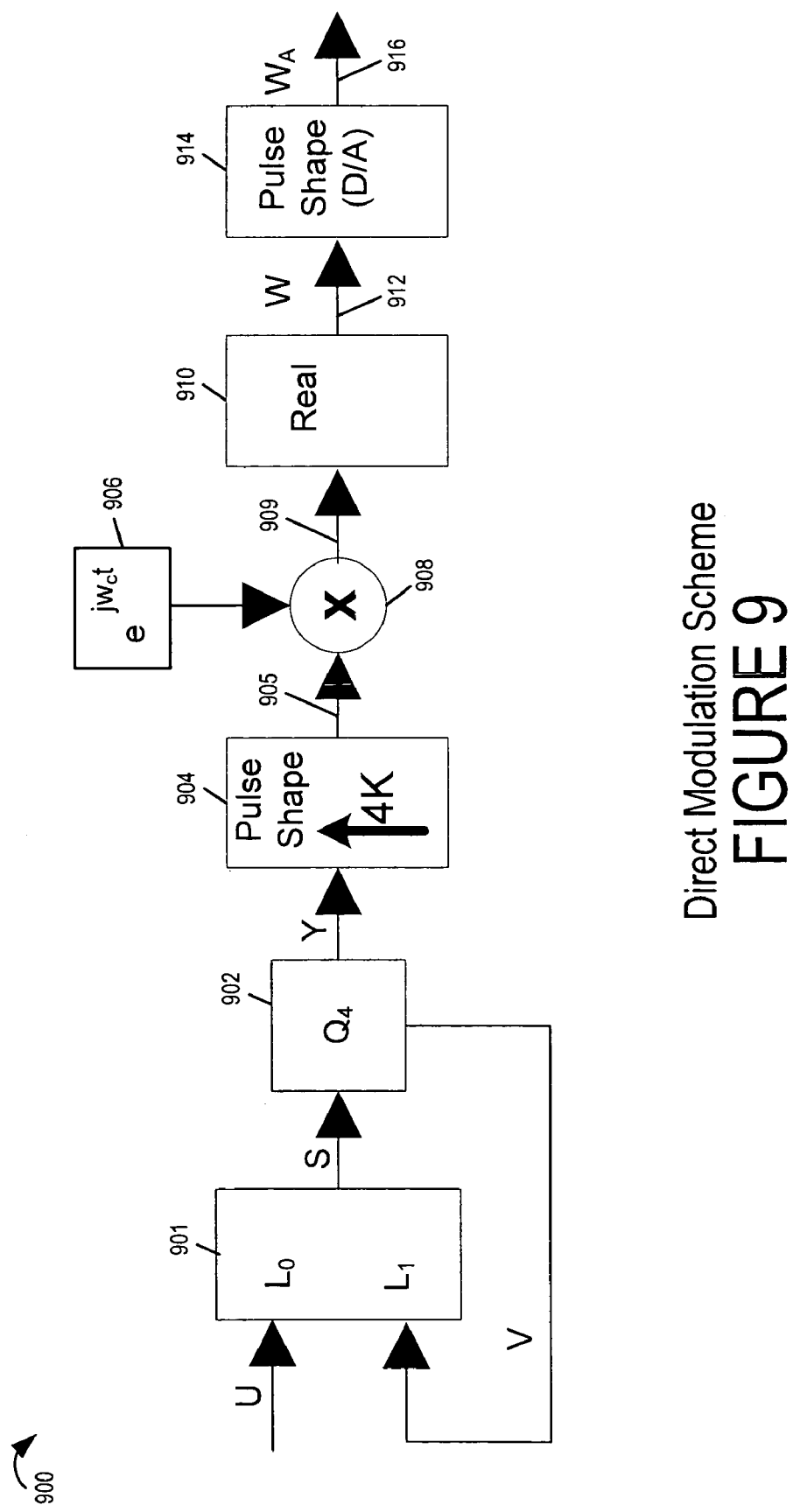
FIG. 9 is a drawing illustrating an exemplary direct modulation scheme in accordance with various embodiments.

Drawing 900 of FIG. 9 illustrates an example of a direct modulation scheme. Drawing 900 includes a linear transform function module 901, a quantizer $Q_4$ 902, a pulse shaping module 904, a multiplier module 908, a real part determination module 910 and a pulse shaping (D/A) module 914 coupled together as shown in FIG. 9. Linear transform function module 901 receives digital input U and input V, performs linear operations, and outputs signal S. Signal S is input to quantizer 902 which generates outputs Y and V. Output V is a feedback to the input of the linear transform module 901, while output Y is an input to pulse shaping module 904. One simple scheme for a frequency shifting ΔΣ modulator, that we will refer to as the direct modulation scheme of the present invention, is the following. Suppose the baseband I and Q signals are ΔΣ converted to produce ±1 representations $$I = \ldots, b_{-1}, b_0, b_1, \ldots$$

$$Q = \ldots, c_{-1}, c_0, c_1, \ldots$$

at a rate of $f_c/K$ samples per second where K is a positive integer. It is more convenient to view these sequences as the functions $$I = \sum_i b_i \delta_{\frac{iK}{f_c}} \text{ and } Q = \sum_i c_i \delta_{\frac{iK}{f_c}}$$

where $\delta_t$ denotes a Dirac delta function positioned at time t. We can think of the pair of functions as the complex function I−jQ, viewing this as a sequence of complex δ functions. The Fourier transform is periodic with period $$\frac{f_c}{K} \text{ Hz.}$$

Consider up-sampling by repeating each sample 4K times, e.g., using pulse shape module 904, so samples now are spaced $T := 1/(4f_c)$ seconds apart. This can be viewed as convolving the function I−jQ with $$\sum_{i=0}^{4K-1} \delta_{\frac{i}{4f_c}}.$$

The Fourier transform of this function is $$\frac{1-e^{-j\omega 4KT}}{1-e^{-j\omega T}} = e^{-j\omega(2K-\frac{1}{2})T} \frac{\sin 2KT\omega}{\sin T\omega/2}$$

a periodic form of the sinc function that is nearly flat across the base-band.

Now consider multiplying this function 905 by $e^{2\pi f_c t}$. 906 using multiplier 908 to produce signal 909. At the sample points, this evaluates to the sequence ..., 1, j, −1, −j, 1, .... This operation translates the Fourier transform by $f_c$ Hz. Taking the real part of the result 909 using module 910 gives $$\sum_i b_i \sum_{k=0}^{K} \left( \delta_{\frac{4(i+k)}{4f_c}} - \delta_{\frac{4(i+k)+2}{4f_c}} \right) + \sum_i c_i \sum_{k=0}^{K} \left( \delta_{\frac{4(i+k)+1}{4f_c}} - \delta_{\frac{4(i+k)+3}{4f_c}} \right)$$

e.g., for K=1, we effectively get the sequence

..., $b_0, c_0, -b_0, -c_0, b_1, c_1, -b_1, -c_1$, ...

in this case.

Finally, the result W 912 is convolved with the square function $$1\left[0, \frac{1}{4f_c}\right)$$

$$\left(1 \text{ on } \left[0, \frac{1}{4f_c}\right)\right)$$

and 0 elsewhere), e.g., by pulse shaping D/A module 914, to yield a ±1 function $W_A$. 916. This can be viewed as a pulse shaping step. The process is illustrated in FIG. 9 where we have introduced the quantizer $Q_4$ 902 to denote the four quadrant quantizer that quantizes the real and imaginary parts of its argument independently to +1 and −1 according to their sign.

Figure 10:
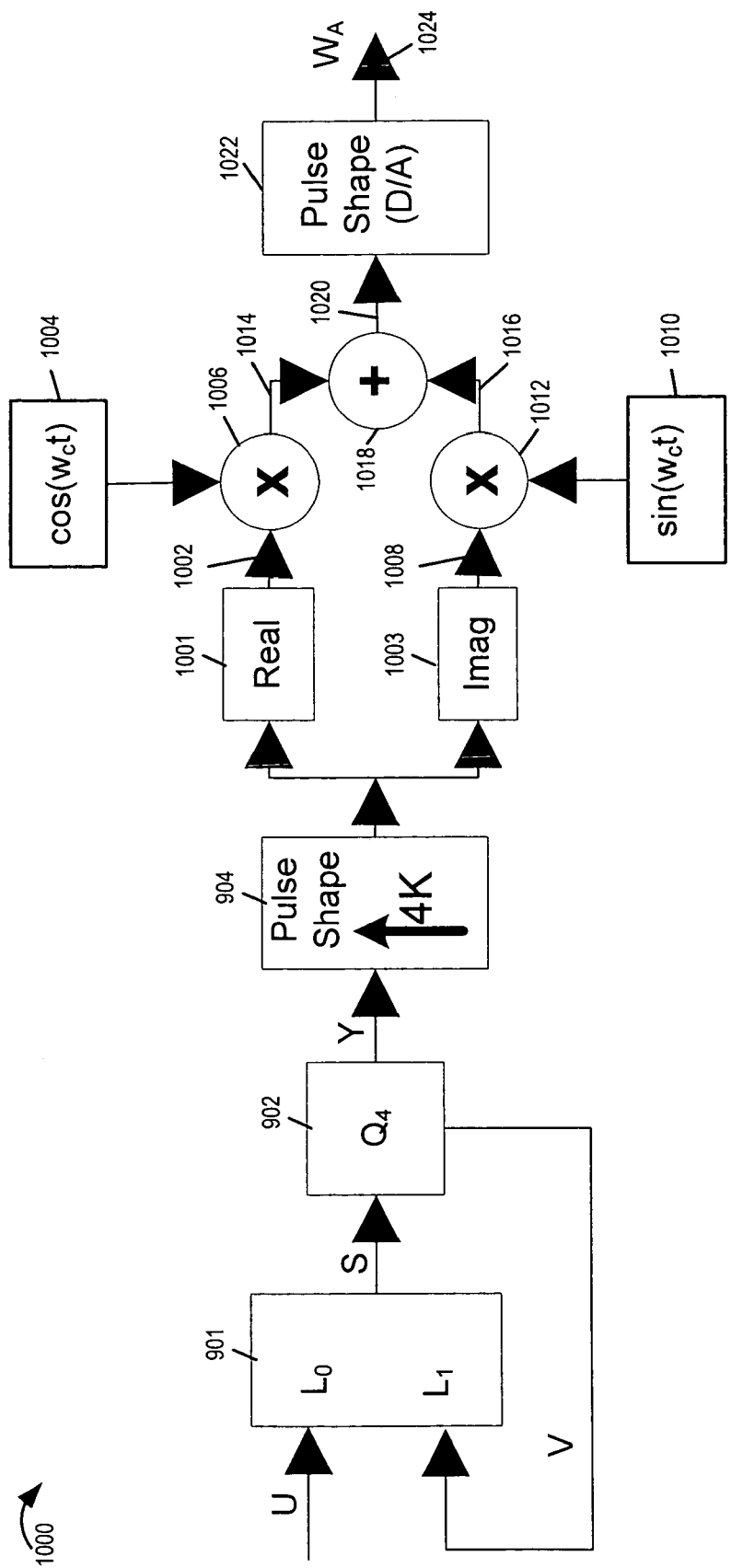
FIG. 10 is a drawing illustrating a Real form of an exemplary direction modulation scheme in accordance with various embodiments.

If we take note of the set of transitions that occur both within a clock period and at the beginning of that period then we may take account of each of the transitions. It is reasonable to expect in this case that the memory effects in the correction can be limited to one ΔΣ clock cycle. Thus, the correction for a given cycle depends on the decision in that given cycle and the one in the preceding cycle, earlier decisions can be ignored. During each ΔΣ cycle the signal $W_A$ is a square wave with the same frequency as the carrier. The impact of the transitions will depend on the phase and amplitude of the current relative to the position of those transitions. +1 to −1 transitions may behave differently than −1 to +1 transitions. Therefore, for the proportional terms we may require 4*16=64 parameters to cover each of the cases. Additional parameters may be used for shifts or if higher order current dependent terms are needed. Consider for example the embodiment shown in drawing 1000 of FIG. 10. Drawing 1000 of FIG. 10 illustrates a real form of a direct modulation scheme. Drawing 1000 includes a linear transform function module 901, a quantizer Q4 902, a pulse shaping module 904, a Real part determination module 1001, a Imaginary part determination module 1003, a first multiplier module 1006, a second multiplier module 1012, a summing module 1018, and a pulse shaping (D/A) module 1022 coupled together as shown in FIG. 10. Note that in FIG. 10, the output of the pulse shaping module 904 is used as input to both the real part determination module 1001 and imaginary part determination module 1003.

Notice that the ΔΣ loop representing U can run at a much slower frequency than $f_c$ (K can be large). For example, if the carrier frequency is 1 GHz then the samples of W are at 4 Gsps (Giga samples per second). The ΔΣ loop for U could run at some fraction of this speed, e.g., 200 Msps (Mega samples per second).

Figure 11:
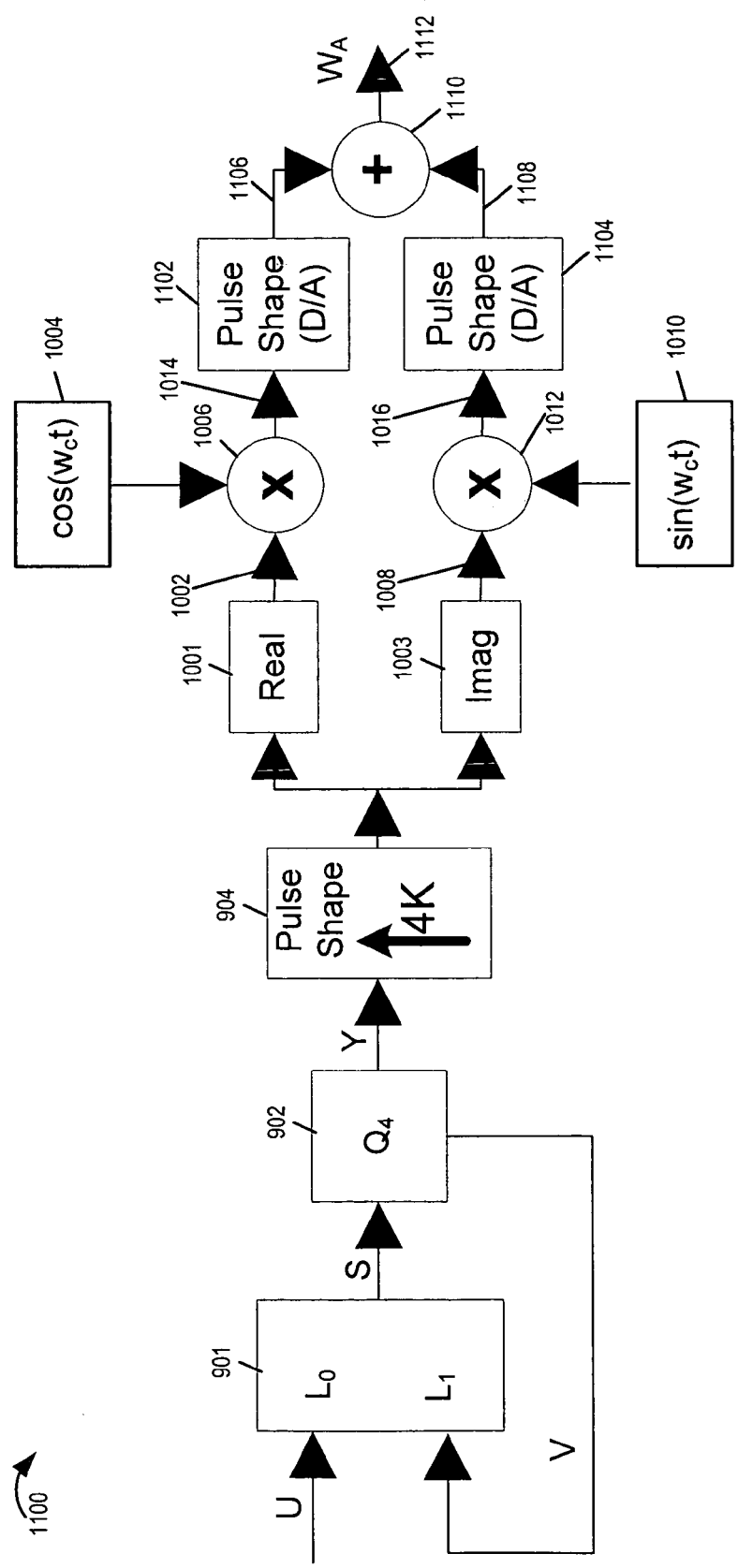
FIG. 11 is a drawing illustrating a re-ordered real form of an exemplary direct modulation scheme in accordance with various embodiments.
Figure 12:
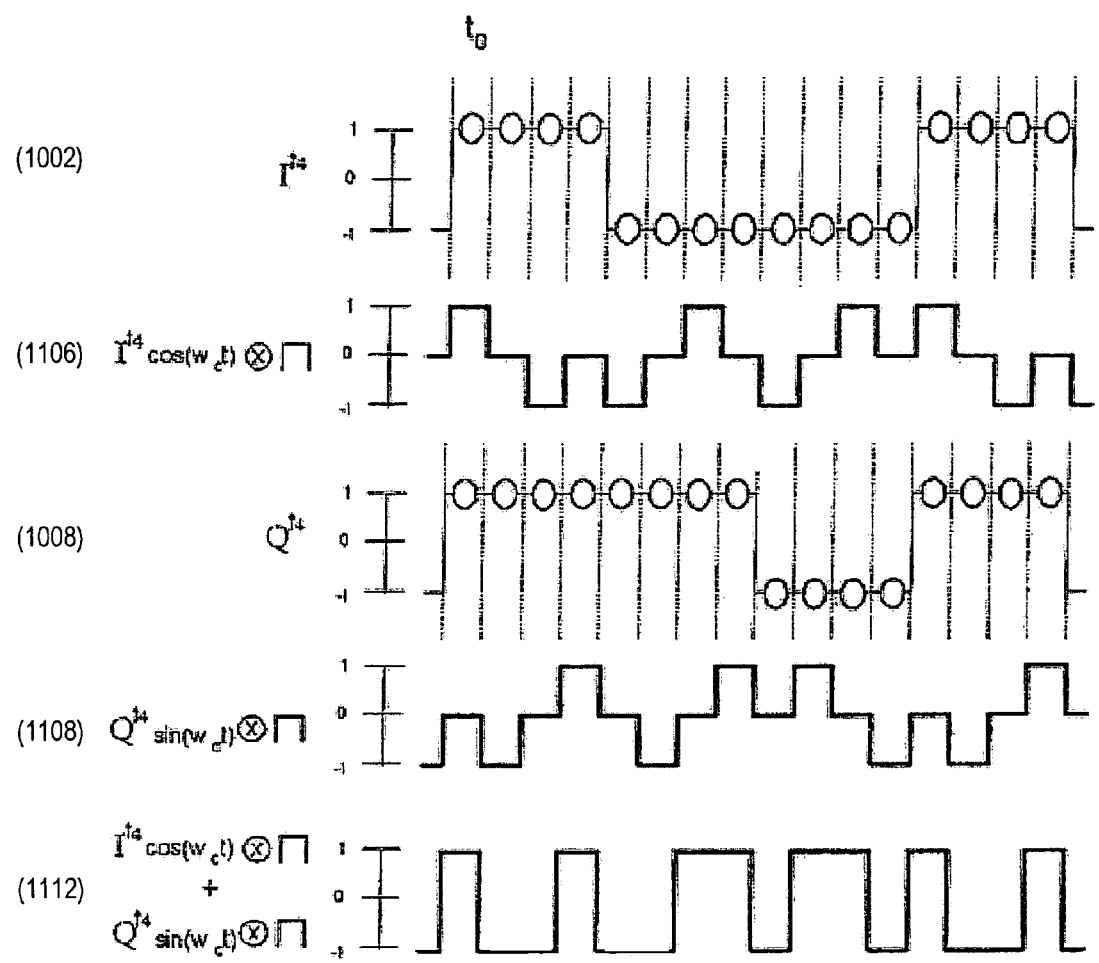
FIG. 12 is a drawing illustrating exemplary waveforms from an exemplary re-ordered real form of a direct modulation scheme in accordance with various embodiments.

The above method can be interpreted in other ways. For example, we can effectively avoid the complex domain as follows. Let $I^{\uparrow 4K}$ and $Q^{\uparrow 4K}$ denote the up-sampled I and Q signals. We multiply $I^{\uparrow 4K}$ 1002 by $\cos(w_c t)$, 1004 using multiplier module 1006 where, of course, $\omega_c := 2\pi f_c$, which at the sample points gives the sequence $$\ldots, 0, 1, 0, -1, 0, 1, 0, \ldots$$

and we multiply $Q^{\uparrow 4K}$ 1008 by $\sin(\omega_c t)$ 1010 using multiplier module 1012 which, at the sample points, gives the sequence $$\ldots, -1, 0, 1, 0, -1, 0, 1, \ldots$$

then the results (1014, 1016) can simply be added together using adder module 1018 to give W 1022. FIG. 10 illustrates this interpretation. The ordering of operations can be changed as shown in drawing 1100 of FIG. 11. Drawing 1100 illustrates a re-ordered Real form of the direct modulation scheme of FIG. 10. In FIG. 11 processing is performed by two pulse shaping (D/A) modules (1102, 1104) prior to subjecting the signals to summing module 1110, while in FIG. 10, the signal summing is performed by summing module 1018 prior to the single pulse shaping (D/A) module 1022. In implementation 1100 of FIG. 11, output signal 1014 from multiplier 1014 is input to pulse shaping (D/A) module 1102, while the output signal 1016 from multiplier module 1008 is input to pulse shaping (D/A) module 1104. The output signal (1106, 1108) from pulse shaping D/A modules (1102, 1104), respectively are input to summing module 1110 which combines the signals and generates output signal $W_A$ 1112. Exemplary waveforms produced by this arrangement are depicted in drawing 1200 FIG. 12 illustrating exemplary signals (1102, 1014, 1008, 1106, 1108, 1112), respectively, when viewed from the top of the page to the bottom of the page.

Figure 13:
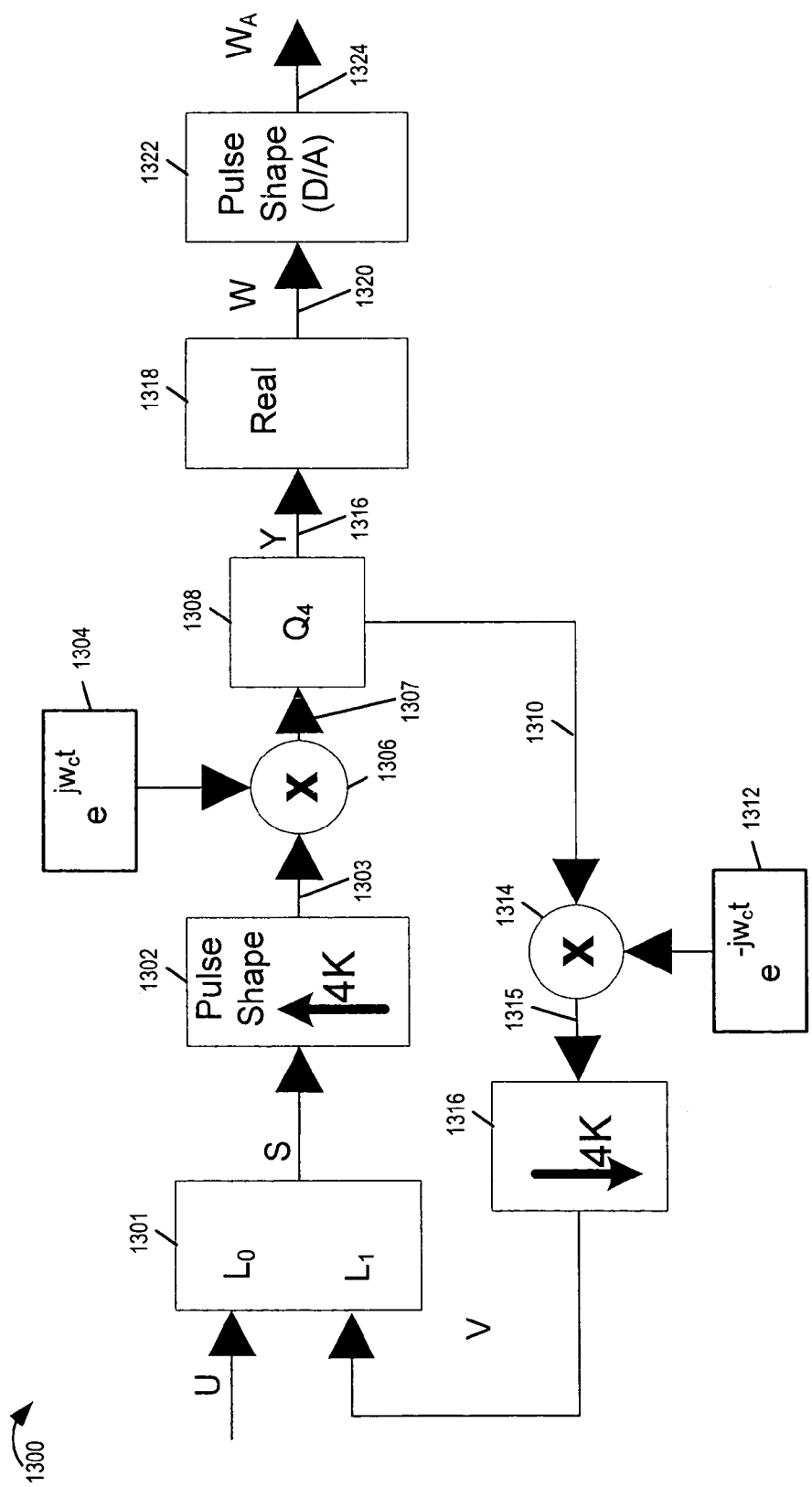
FIG. 13 is a drawing illustrating a time varying quantizer form in accordance with various embodiments.

A more suggestive variation in accordance with another feature of the invention is shown in drawing 1300 FIG. 13. Here the up-sampling by 4K and multiplication by $e^{j\omega_c t}$ has been placed prior to the quantizer. Linear transformation function module 1301 receives inputs U and V, performs linear operations, and outs signal S. Signal S is an input to pulse shaping module 1302. Pulse shape module 1302 outputs signal 1303 which is input to multipler module 1306. The multiplier module 1306 multiplies input signal 1303 with $e^{j\omega_c t}$ 1304 resulting in signal 1307 which is input to quantizer $Q_4$ 1308. The symmetry of the quantizer 1308 matches the timing so that if the output of the quantizer $Q_4$ 1310 is multiplied by $e_{-j\omega_c t}$ 1312 by multiplier module 1314 resulting in signal 1315 and then signal 1315 is down-sampled by 4K by module 1316 resulting in V, then the operation is as before. Note that the operations of modules 1314 and 1316 (demodulation and down sampling) perform the inverse of modules 1302 and 1316 (up sampling and modulation). The output Y 1316 from $Q_4$ is already centered around $\omega_c$. In such an embodiment, we take the real part of signal y 1316 using module 1318 and obtain signal W 1320. Signal W 1320 is subjected to pulse shaping by pulse shaping (D/A) module 1322 obtaining output signal $W_A$ 1324. Notice that the imaginary output of the quantizer is not used in such an embodiment except in the feedback path. We can remove it also from the feedback path provided we adjust the down-sampling appropriately. This shows that it is viable to have a real quantizer operating within the ΔΣ loop in accordance with some embodiments of the invention.

5.1.1 Implementation with Delays

Figure 14:
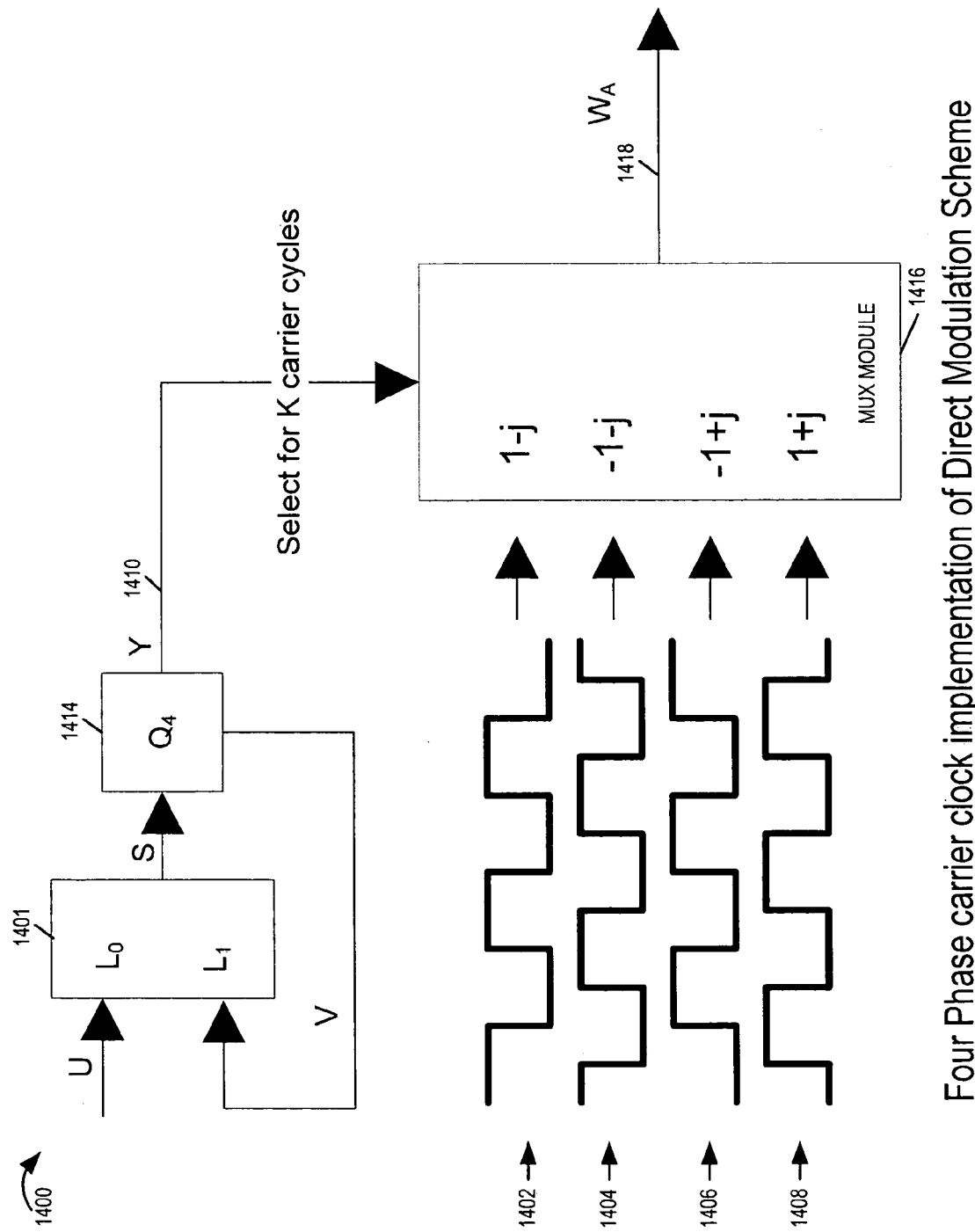
FIG. 14 is a drawing illustrating an exemplary four phase carrier clock implementation of an exemplary direct modulation scheme in accordance with various embodiments.

The direct modulation scheme may seem to require an output clock at frequency $4f_c$, or at least an invertible square clock at frequency $2f_c$. However, we can implement the above scheme, with a square-wave clock running at $f_c$ by providing the a clock having four equally spaced phases, and by selecting between them using the complex output of the quantizer. Drawing 1400 of FIG. 14 illustrates a circuit implemented in accordance with this feature of the invention that uses this idea. Drawing 1400 illustrates an exemplary four phase carrier clock implementation of a direct modulation scheme in accordance with various embodiments of the invention. Digital input U and feedback input V are used as input by linear transform function module 1401, which performs linear operations and outputs signal S to the input of quantizer $Q_4$ 1414. A clock having four equally spaced phases (1402, 1404, 1406, 1408) is provided. Complex output Y 1410 of quantizer $Q_4$ 1414 is used by multiplexer module 1416 to select between the four phases of the clock outputting signal $W_A$ 1418. A selection is applied for a duration of K carrier cycles. In various embodiments, the switching rate of the mux 1416 is slower than the clock rate.

5.2 More General Forms and Offset Clocks

Figure 15:
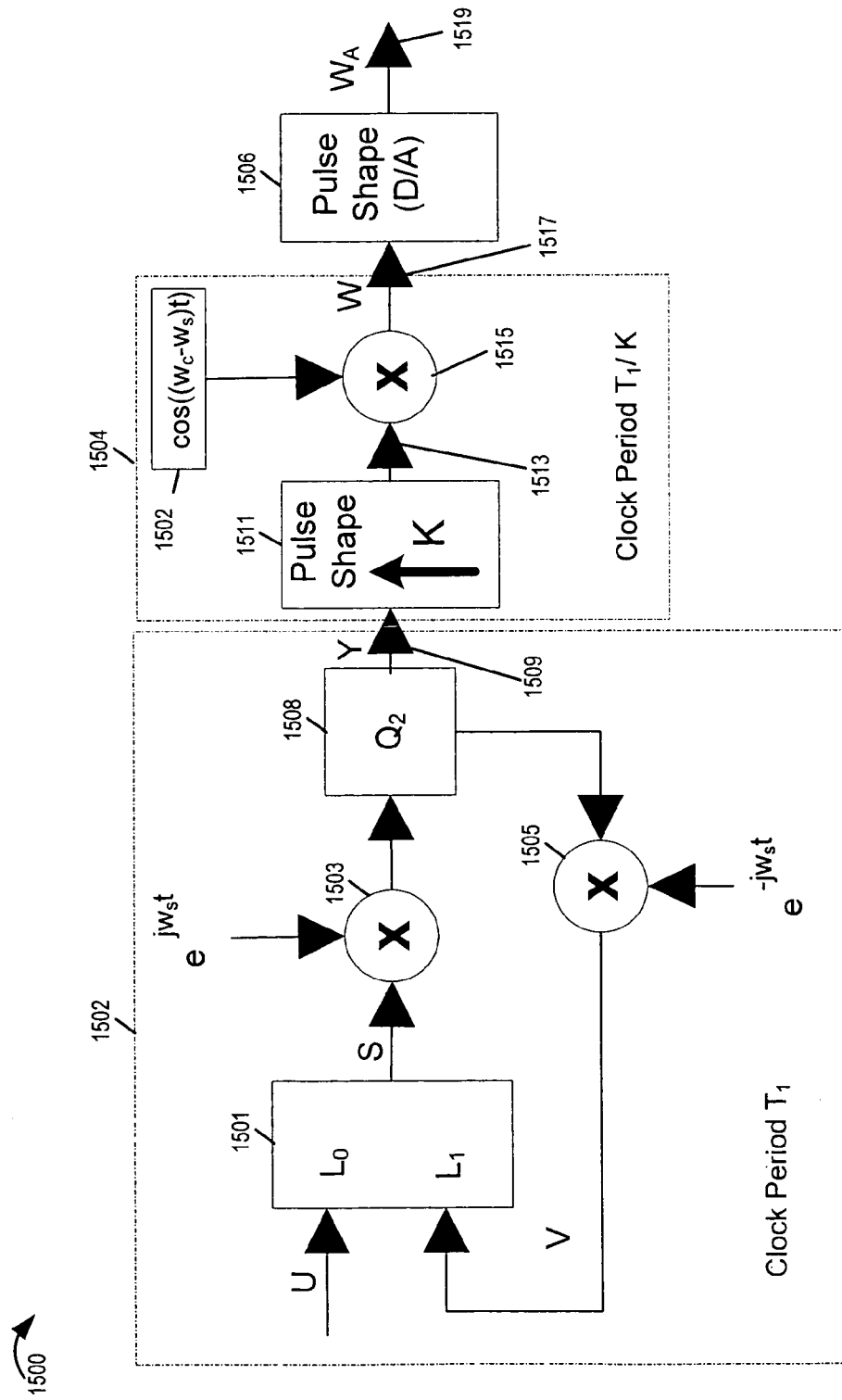
FIG. 15 is a drawing illustrating an alternative frequency shifting DeltaSigma form used in various embodiments.

Another variation on the frequency shifting ΔΣ is depicted in drawing 1500 of FIG. 15 where we have also indicated different clock domains. Drawing 1500 illustrates an alternate frequency shifting DeltaSigma form including a $1_{st}$ stage 1502 having a clock period $T_1$ followed by a second stage 1504 having a clock period $T_1/K$. The second stage 1504 is followed by a pulse shaping (D/A) 1506.

The first stage 1502 includes a linear transform function module 1502, a first multiplier 1503, a quantizer $Q_2$ 1508 and a second multiplier 1505. Linear transform function module 1501 receives digital input U and feedback input V, performs linear operations, and generates output signal S. Output signal S and $e^{jwst}$ are inputs to multiplier module 1503 which outputs a signal to quantizer 1508. Output signal Y from quantizer 1508 is an input to the second stage 1504. An output from quantizer 1508 and $e^{jwst}$ are inputs to multiplier module 1505 resulting in output signal V.

Note that in the FIG. 15 embodiment, we have used quantizer $Q_2$. 1508. This quantizer 1508 produces ±1 depending on the sign of the real part of its argument. Since the output Y 1509 of the quantizer 1508 is real we do not need to select the real part and the $e^{j(\omega_c - \omega_s)t}$ factor is replaced with $\cos((\omega_c - \omega_s)t)$. In second stage 1504, input signal Y 1509 is processed by pulse shaping module 1511 generating signal 1513, which is multiplied with $\cos((\omega_c - \omega_s)t)$. 1502 by multiplier module 1515 generating signal W 1517 which is output from the second stage 1504. The pulse shaping module 1506 processes signal W 1517 and generates signal $W_A$ 1519.

Figure 16:
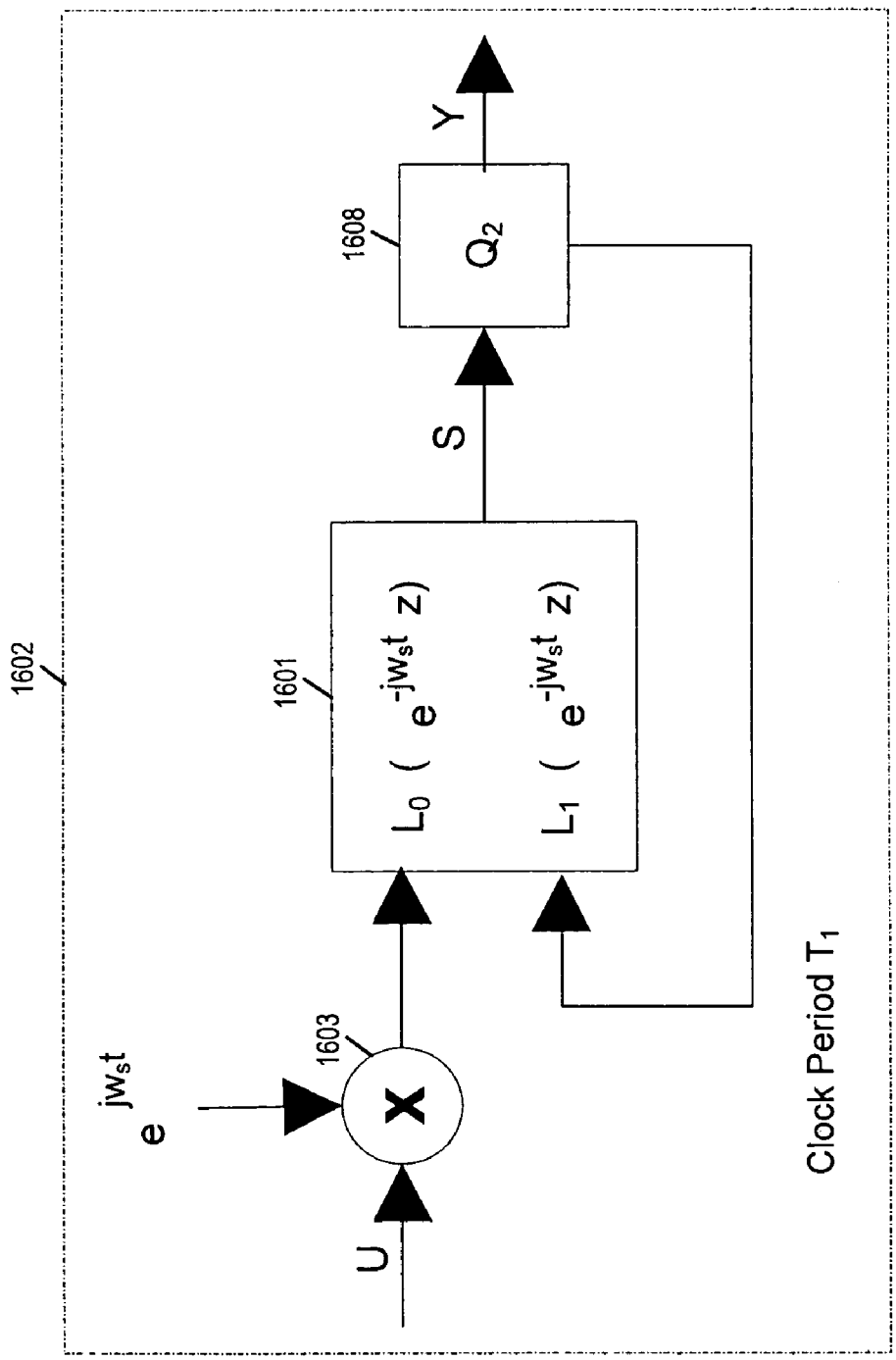
FIG. 16 is a drawing illustrating an alternative equivalent first stage that may be used in the frequency shifting Delta-Sigma of FIG. 15.

We remark in passing that the first stage 1502, with clock period $T_1$, has an equivalent form as illustrated in equivalent first stage 1602 of FIG. 16. First stage 1602 includes a multiplier module 1603, a linear transform function module 1601 and a quantizer $Q_2$ 1608 coupled together as shown in FIG. 16. Digital input signal U and $e^{jwst}$ are inputs to multiplier module 1603 which outputs one of the inputs to the linear transform function module 1601. The other input to the linear transform function module 1601 is an output of quantizer 1608.

Here the input U is modulated up to $\omega_s$ by module 1603 and, in the transfer functions $L_0$ and $L_1$, z is replaced with $e^{-j\omega_s T_1 z}$, effectively rotating the unit circle in the z domain to center on $\omega_s$. Equivalence holds regardless of the quantizer, i.e., not just for $Q_2$.

The frequency $\omega_s$ represents a partial shifting of frequency. Even negative values for $\omega_s$ are conceivable, but we will focus on positive values. Various possible choices for the parameters will now be discussed. Let us start by setting $\omega_s = \alpha \omega_c$ where $\alpha$ is a fraction. The sample times in the first loop are multiples of $T_1$. For convenience of implementation we might choose $T_1$ so that $e^{jw_s(kT_1)} \in \{1,j,-1,-j\}$. We can achieve this if $f_sT_1 = \alpha f_cT_1$ is a multiple of $$\frac{1}{4}$$

(odd multiples preferably). For example let us set it to $$\frac{1}{4},$$

so $$\alpha f_c T_1 = \frac{1}{4}$$

We observe that the quantizer $Q_2$ alternates between quantizing the real and imaginary part. By construction the output of the quantizer Y approximates the input signal shifted to center frequency $\omega_s$. In other words, $$\sum_i Y_i j^{-i} \delta \frac{i}{T_1}$$

approximates U.

Similarly, in order to ensure that $W_A$ is a two-valued function, we choose $$(1-\alpha)f_cT_1/K = \frac{1}{2}$$

so that, in the faster processing, we have $$\cos\left((1-\alpha)\omega_c\left(k\frac{T_1}{K}\right)\right) \in \{1,-1\}$$

(where k is an arbitrary integer). We therefore obtain the relation $$\frac{1-\alpha}{\alpha} = 2K$$

which yields $$\alpha = \frac{1}{2K+1}.$$

Finally, we pulse shape with a square pulse of width $$\frac{\pi}{\omega_c - \omega_s}$$

to give a ±1 function $W_A$.

Notice that an equivalent implementation, and this was the underlying motivation, is to simply take the output Y and use it to modulate a square wave clock of frequency $$\frac{\omega_c - \omega_s}{2\pi}.$$

Figure 17:
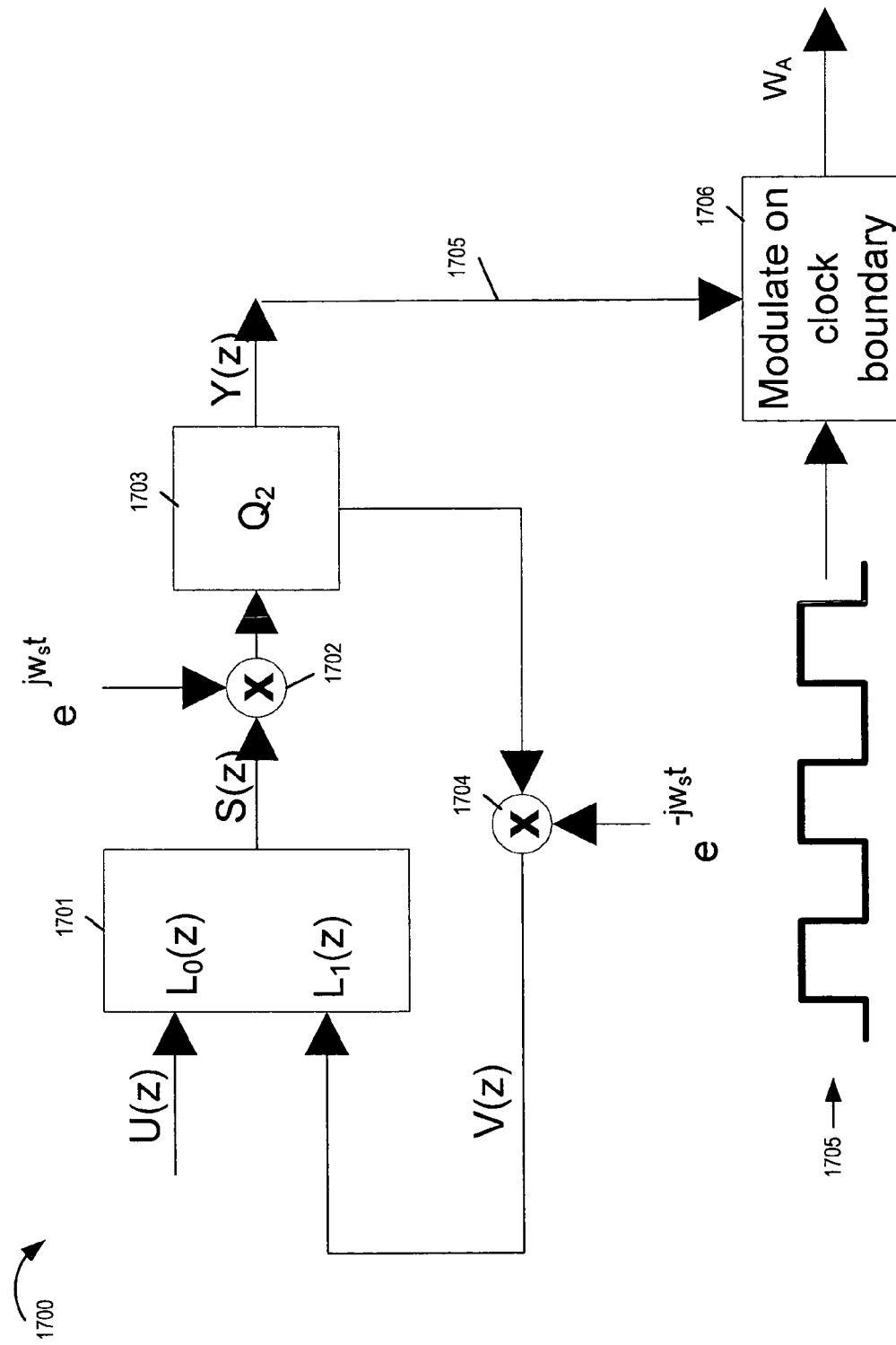
FIG. 17 is a drawing illustrating a DeltaSigma modulator module being used to modulate a single clock in accordance with various embodiments.

The scheme of the present invention is depicted in drawing 1700 of FIG. 17. Drawing 1700 includes a linear transform function module 1701, a first multiplier 1702, a quantizer $Q_2$ 1703, a second multiplier 1704, a clock 1705, and a clock boundary modulation module 1606, coupled together as shown in FIG. 17. Linear transform function module 1701 receives as input U(z) and V(z), performs linear operations and generates output signal S(z). Output signal S(z) and $e^{jw_st}$ are inputs to multiplier module 1603 which outputs a signal to quantizer $Q_2$ 1703. Quantizer $Q_2$ 1703 quantizes into 2 quantities, e.g., such as with BPSK quantization. Output Y(z) 1705 from quantizer 1703 is a control input to module 1706, which decides whether or not to invert the clock input as a function of the control input signal 1705. Module 1706 receives input clock 1705 and outputs $W_A$. Module 1706, performs flipping of the clock, as determined, on clock boundaries. Thus signal $W_A$ either matches the clock or is an inverted version of the clock at any given time.

One advantage of this method of the invention, besides the fact that it can be implemented with a single clock of frequency lower than $f_c$, is that it can significantly reduce the number of parameters needed for correction. There are two possible waveforms in each cycle rather than four. The number of proportional parameters needed is therefore reduced by a factor of four from the previous case (still assuming single symbol memory).

In such an embodiment we can still use a symmetric clock (or a clock at twice the frequency) to avoid additional correction terms.

5.3 Zero-One Signals

So far we have limited our discussion to systems and embodiments that produce ±1 signals. Here we will consider signals that use instead 1 and 0. Such embodiments will be seen to have several advantages with regard to correction.

Figure 18:
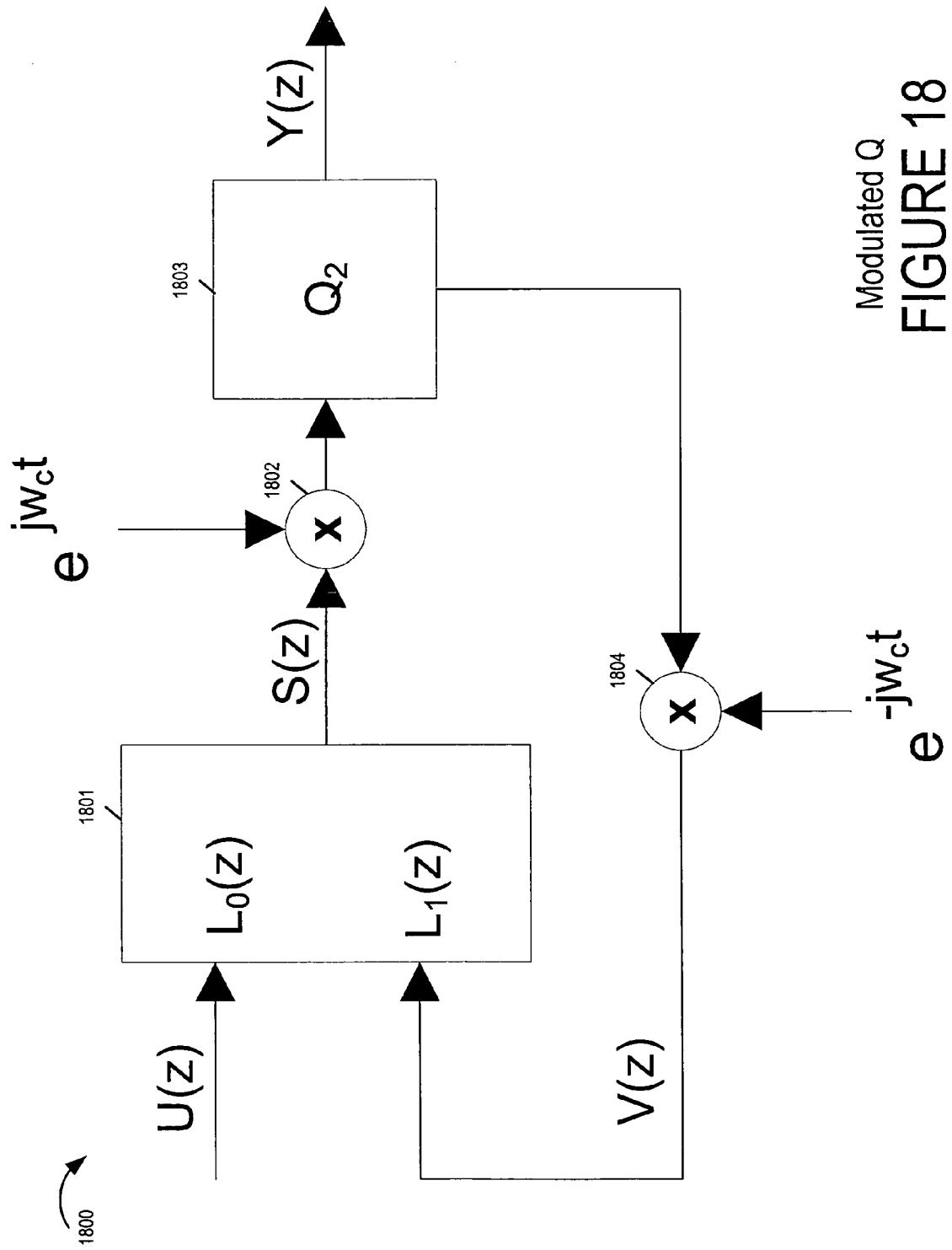
FIG. 18 is a drawing illustrating an exemplary DeltaSigma modulator module including a two level quantizer used in various embodiments.

Let us consider the very simple variation of the invention shown in FIG. 18 and let us assume that the clock speed is high, on the order of the carrier frequency. FIG. 18 may be a special case of a FIG. 17 embodiment. Drawing 1800 of FIG. 18 includes a linear transform function module 1802, a first multipler module 1802, a quantizer $Q_2$ 1803, and a second multiplier module 1804, coupled together as shown. Linera transform function module 1801 receives input signal U(z) and feedback signal V(z) as inputs, performs linear operations using function $L_0(z)$ and $L_1(z)$, combines results and outputs signal S(z). Multiplier module 1802 receives S(z) and $e^{jw_st}$ as input and outputs a signal which input to quantizer $Q_2$ 1803. Quantizer Q2 outputs signal Y(z). The output from quantizer $Q_2$ 1803 is also input to second multiplier module 1804, which multiples the output from the quantizer 1803 with $e^{-jw_st}$ obtaining V(z) Let the quantizer 1803 by asymmetrical, producing only the real values 0 and 1. Some region around the point (1,0) gets quantized to 1, all other points quantize to 0. Ideally, the output Y is a 1,0 discrete signal that approximates the real part of the desired signal in the band of interest.

Let p/q be a fraction in lowest terms. Consider a clock that has q cycles for every p cycles of the carrier. Each cycle of the clock traverses $\phi$ radians of the carrier where $q\phi = p2\pi$ or $\phi = (p/q)2\pi$. Thus, the sample times are $p/(qf_c)Z$ so $$e^{jw_ct} \in \{1, e^{2\pi/q}, e^{4\pi/q}, \ldots, e^{(q-1)2\pi/q}\},$$

taking q possible values. Thus Y is a 0,1 sequence and $$\sum_i Y_i e^{-j\omega_c\left(i\frac{p}{q}\right)} \delta_{\left(i\frac{p}{q}\right)}$$

approximates U in the baseband. We pulse shape Y by using a square wave of width $$\frac{p}{2q}$$

and it can be implemented by gating (allowing a pulse or not) a clock of frequency $$\frac{q}{p}f_c.$$

Figure 19:
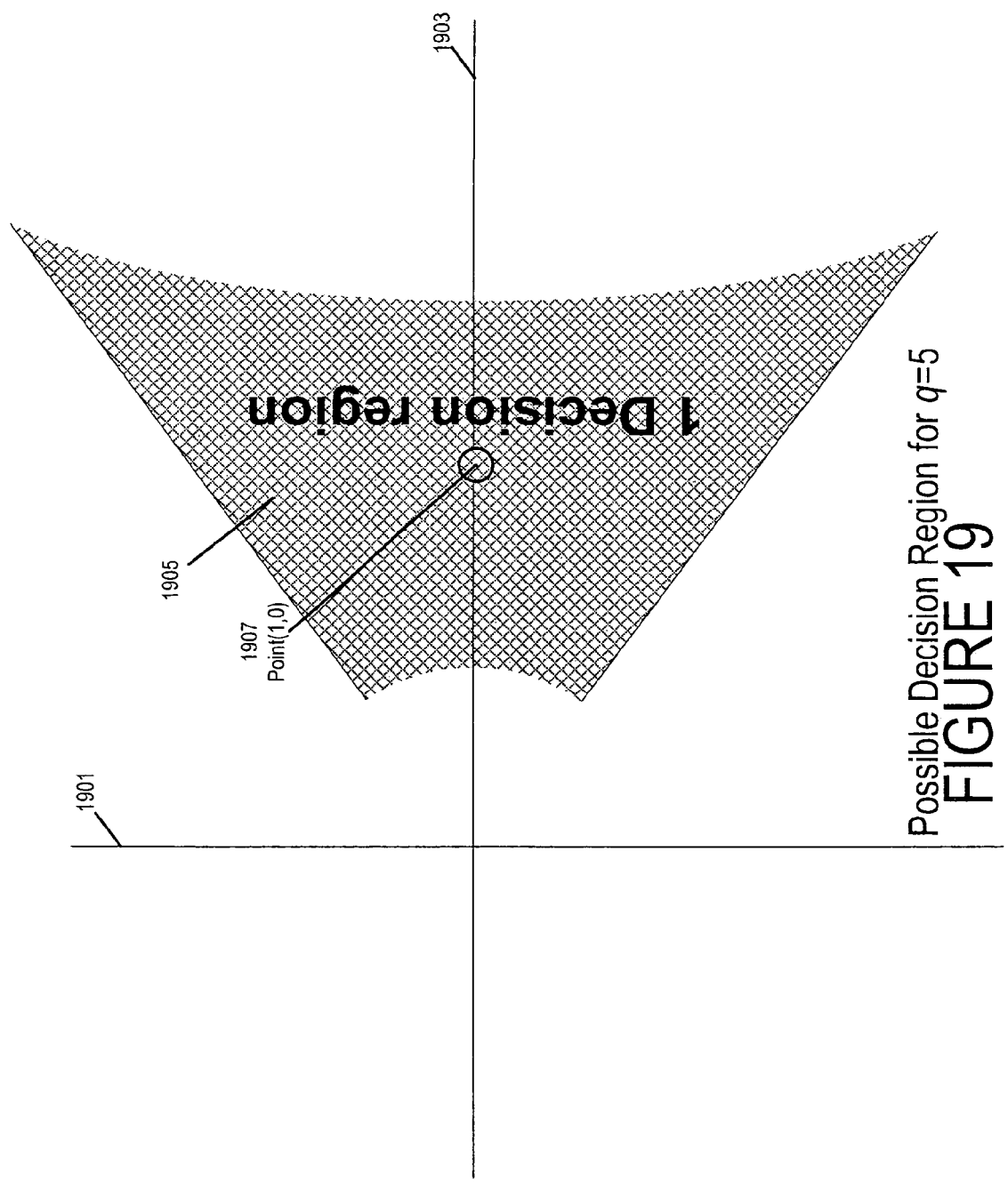
FIG. 19 is drawing illustrating exemplary possible descision regions for an exemplary embodiment.

If q=5 for example, a quantizer might be chosen as indicated in FIG. 19 where a 72 degree cone covers the region where a 1 is selected, a region around the origin being excluded. The cone could be chosen wider, e.g. 90 degrees, to simplify implementation and to encourage selection of multiple points in q cycles. FIG. 19 is a drawing 1900 illustrating an exemplary possible decision region for q=5. Drawing 1900 illustrates the complex plane with vertical axis 1901 representing the Imaginary axis and horizontal axis 1903 representing the Real axis. Point (1,0) 1907 is shown, and area 1905 gets quantized to 1, all other points in the plane quantize to 0.

With a second order circuit the effect of the decision is not seen until two clocks later. Thus, if p does not equal 1 or q−1 modulo q then it is very unlikely that a 1 will be picked two cycles in a row (and it could be enforced). Thus, each 1 is likely to be followed by a zero. Correction in this case can be nearly memoryless or possibly memoryless, which can be an advantage over some other embodiments.

It is feasible to slow down the $\Delta\Sigma$ clock in such a scheme. For example an architecture such as shown in FIG. 15 in which $Q_2$ is replaced with a 0-1 quantizer is possible, but it reduces to repetition in the second stage. Indeed, set $\omega_s = \alpha \omega_c$ and set the clock period $T_1$ such that $$\alpha f_c T_1 = 2/q.$$

Then $$(1-\alpha) f_c T_1 / K = 1.$$

so $$\frac{1-\alpha}{\alpha} = Kq/2$$

or $$\alpha = 1/(1+Kq/2).$$

FIG. 19 shows a possible decision region for q=5.

Since the driving signal is only 0 and 1 and all phase information is carried in pulse position, correction requirements are tremendously reduced. If all 1s are followed by at least one 0, then switching effects can be expected to be memoryless, assuming appropriate pulse shaping. Asymmetry in up and down transitions is irrelevant since this just affects the pulse shape and a single form maybe used. As long as the clock is accurate, the corrections can be limited to current dependent ones. Moreover, in such an embodiment since there is a single pulse shape, a single correction function can be used.

6 Striding $\Delta\Sigma$.

It can be advantageous for noise shaping to run a $\Delta\Sigma$ loop at a high clock rate, much higher than the Nyquist rate of the signal. In many embodiments, for the input sampling it is usually sufficient to sample at some smaller multiple of the Nyquist frequency, e.g. 16 times, so that images in the Frequency domain are sufficiently far away. Subsequent to that, the signal can be up-sampled by repetition by a factor of K say to the clock rate of the $\Delta\Sigma$. This means, however, that the input to the $\Delta\Sigma$ is predictable for those K−1 repetitions. Given the state $X_0$ of the $\Delta\Sigma$ and the input $U_0$ the states up until $X_K$ are determined. Instead of running the $\Delta 93$ loop for these cycles, we can, and in various embodiment do, stride directly to the state $X_K$ and produce the K outputs for the steps. In such implementations we are free to generalize in several ways. We can, and in some embodiments do, choose the outputs differently, non-causally for example, and update the state accordingly. The decision rules for sequences can be more complicated then in single step $\Delta\Sigma$. In a high order $\Delta\Sigma$, for example, we could first choose sequences so as to minimize the error in the first integral and then, among viable choices, minimize the error in the second, and so on. Different functionals can also be used. For example we have multi-dimensional representations of possible sequences, in some embodiments, indicating their impact on the state of the $\Delta\Sigma$, and then several functionals of the current state and input are used to select the sequence. Moreover, in at least some but not necessarily all such embodiments, the delays inherent in standard $\Delta\Sigma$ can be partially eliminated.

The output in various embodiments gets mapped to a two-level function and the state update is effectively performed at the higher clock rate.

Let us here give a simple example of an application of the striding concept using the frequency shifting $\Delta\Sigma$ modulator presented in Section 5.3. Let the striding $\Delta\Sigma$ step with a clock of period $p/f_c$, i.e. p periods of the carrier. During that period the bit clock in this example runs through exactly q cycles. At each possible sample point the $\Delta\Sigma$ may select to transmit a given pulse waveform, the timing of the pulse giving rise to a distinct phase offset with respect to the carrier of a multiple of $2\pi/q$ modulo $2\pi$. Assuming for the moment that only zero or one pulse can be selected in each q cycle period, the modulation is approximately equivalent to choosing a qth root of unity point in baseband, or the origin. Choosing one of the q+1 possibilities. In a single striding update, we recognize that it involves q clock cycles and, depending on the point chosen, the state will be appropriately updated.

Figure 20:
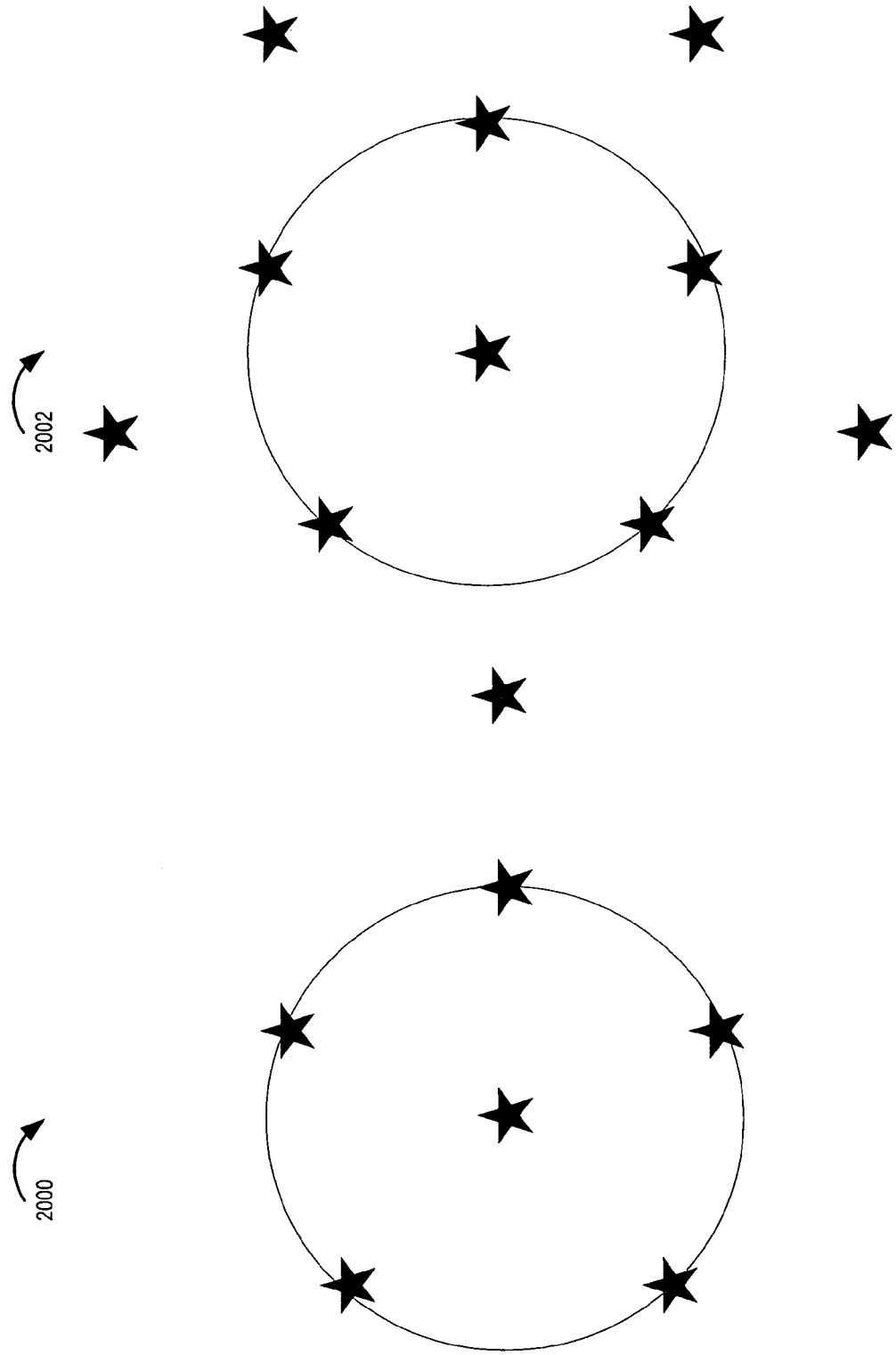
FIG. 20 is a drawing illustrating exemplary six and eleven point constellations used in various embodiments.

We could also, e.g., allow pairs of adjacent (in phase) pulses to be chosen. In the constellation, such pairs can be represented by the sum of the corresponding points. If p modulo $q \in \{1, q-1\}$ then pulses which are adjacent in phase are not adjacent in time. In this case, one might reasonably expect that the correction process could be essentially memoryless, reducing its complexity. FIG. 20 shows possible constellations for q=5 and p=2 with and without allowed pairs. Drawing 2000 of FIG. 20 shows an exemplary six point constellation facilitating pairs of adjacent pulses to be chosen. Drawing 2002 of FIG. 20 shows an exemplary 11 point constellation without allowed pairs.

Figure 21:
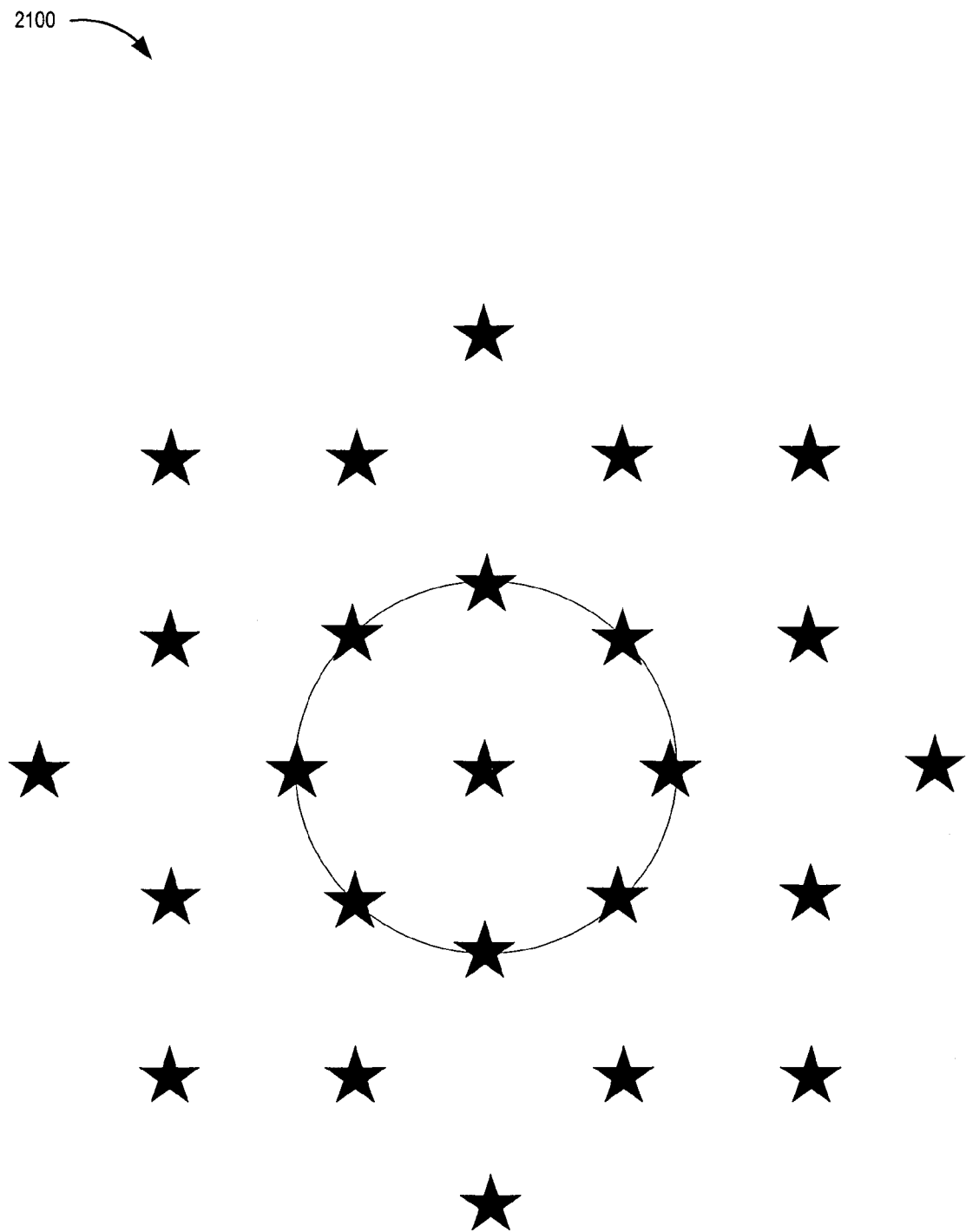
FIG. 21 shows an exemplary constellation that may be used if a clock that is 8 times the carrier frequency is available, in accordance with various embodiments.

Notice how with a striding ΔΣ we can impose constraints on used waveforms. This can be exploited to a greater extent taking advantage of very fast digital circuits. Suppose for example, a clock that is 8 times the carrier frequency is available. We can use a pulse, triggered by the clock, as our driving signal. In addition, however, we allow the pulse to last either 1, 2, or 3 cycles long. The allowed pulses are therefore of three types, along with time shifts. Let us assume that striding ΔΣ is clocked at the carrier frequency. In each clock cycle it chooses the length of the pulse, 0, 1, 2, or 3, and, assuming 0 is not chosen, its starting point. This is similar to picking a point from the constellation shown in FIG. 21. Drawing 2100 of FIG. 21 shows an exemplary constellation that may be used if a clock that is 8 times the carrier frequency is available.

Each layer of points may require a fixed correction for differences in pulse shaping, but this would be one complex parameter per additional level beyond the first (two in this example), since phase symmetry holds. For current dependent correction, each type of pulse can use its corresponding set of parameters, (three in this example).

A striding ΔΣ can be run at a slower clock. In the above example, it can make a decision every K cycles of the carrier. We could think of this as choosing from the constellation K times. To simplify the implementation we can implement one choice with repetition. We might allow from 1 to K repetitions. This is similar to using a larger constellation which includes the current one and each point scaled by factor of 2,3, ..., K. For value of the first integral, this is equivalent. For each first integral value, however, we can freely choose which cycles receive the pulses (assuming less than K) in order to minimize higher order error terms.

We have mentioned several times that various schemes have the advantage of memorylessness in the correction. For striding ΔΣ this can, and in some but not necessarily all embodiments is, enforced. For example, in the above scheme where we repeat a pulse, even if repeated pulses have memoryless correction, it is possible that at boundaries, between decision regions, pulses could be close enough together to interact, introducing the use of memory in implementing the correction. In some embodiments a striding ΔΣ simply uses a small buffer region, e.g., a certain period in which no pulses are allowed, at the end of its decision period thereby allowing for memoryless correction.

A striding ΔΣ can mimic multi-bit or multi-level ΔΣ. There are some differences with regard to higher order integrals. One could, however, choose a sequence for each constellation point so that the overall behavior is similar to a multi-bit ΔΣ. In such embodiments, performance advantages of using a multilevel ΔΣ would accrue. Even better performance might then be possible by choosing among other sequences that equate to the same constellation point under first order considerations.

It will be apparent that the striding ΔΣ concept applies equally well to real ΔΣ and also to ΔΣ that are not necessarily frequency shifting.

7 Calibration

The proposed methods may, and in some embodiments do, involve the evaluation of certain parameters representing non-ideal behavior of the switching amplifier, e.g., under actual conditions of use. These parameters may vary over time due to, e.g., thermal drift. Thus, on-line calibration of the parameters can be useful and is performed in some but not necessarily all embodiments.

Figure 22:
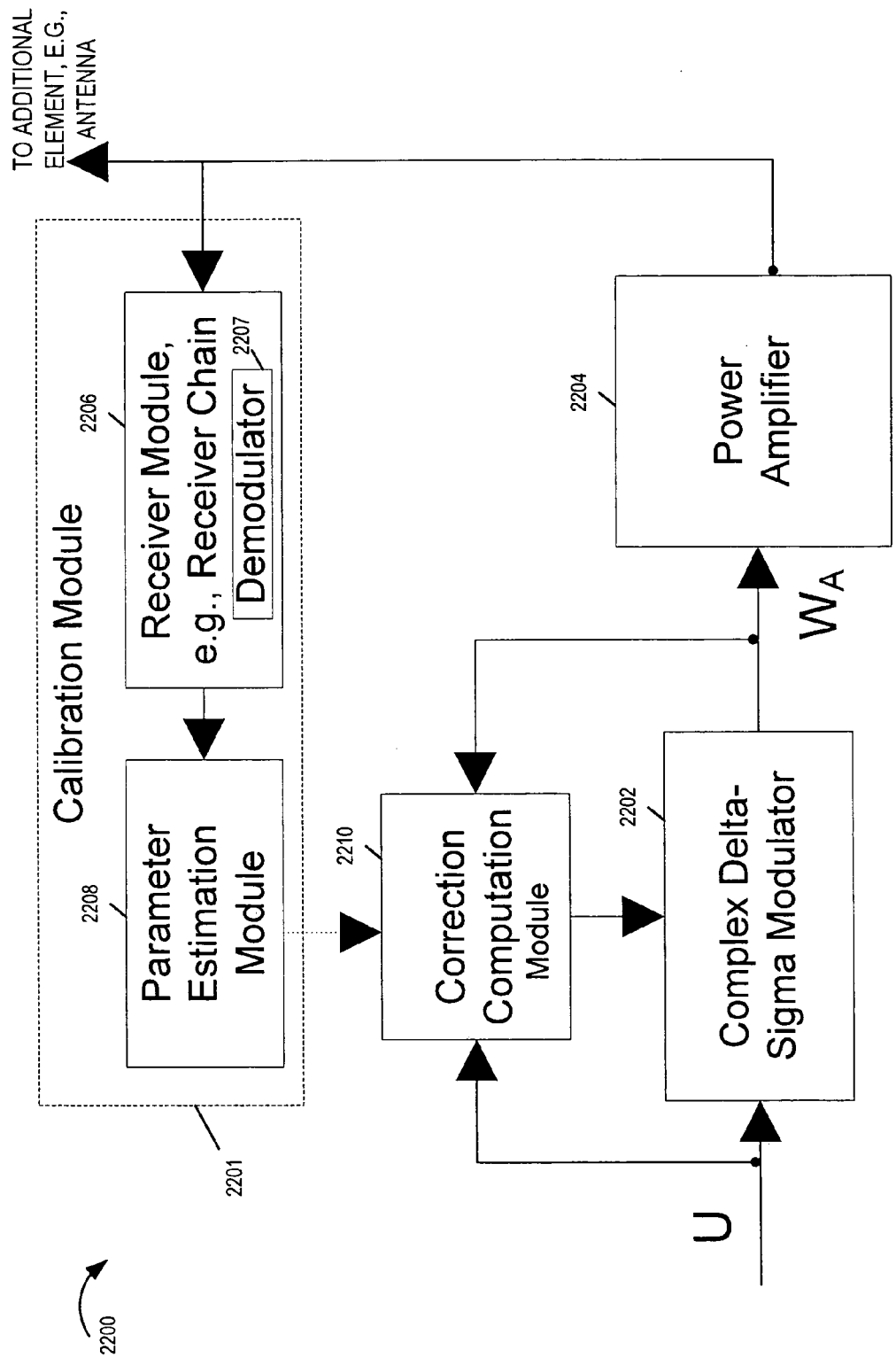
FIG. 22 is a drawing illustrating exemplary receiver based calibration in accordance with various embodiments.

FIG. 22 is a drawing 2200 of exemplary receiver based calibration used in various embodiments. Drawing 2200 includes a complex Delta-Sigma Modulator module 2202, a power amplifier 2204, a receiver chain 2206, a parameter estimation module 2208, an a correction computation module 2210 coupled together as shown in FIG. 22. The parameter estimation module 2208 and receiver module 2206 are part of a calibration module 2201. The receiver module 2206, in the illustrated embodiment, includes a demodulator 2207. However, in other embodiments the demodulator 2207 may be omitted from the receiver circuitry. Input signal U is an input to both the complex Delta-Sigma Modulator 2202 and correction computation module 2210. Signal $W_A$ is an output of the complex Delta-Sigma Modulator module 2202 and is an input to the power amplifier 2204 and correction computation module 2210. The power amplifier outputs a signal which is transmitted from the device and fed back into receiver chain 2206. The power amplifier 2204 has a characteristic physical behavior which is modeled in accordance with various embodiments. The output of the power amplifier is coupled to the input of the receiver module 2206 and also to an additional element, e.g., antenna, which is not shown. In some embodiments, a connection to the antenna is used as the source of the signal being supplied to the receiver 2206. In some but not necessarily all embodiments, a load and/or filter, not shown, may be coupled between the power amplifier output and the receiver module 2206. The receiver module output signal is an input to the parameter estimation module 2208. The output of the parameter estimation module 2208 is an input to the correction computation module 2210. When used in a communications device, the receiver module 2206 used to support device calibration through processing of the signal being generated, e.g., for transmission, may be in addition to a receiver in the communications device used for processing signals received by the device from a wireless communications channel.

Receiver chain 2206 obtains noise free or nearly noise free reception, in some embodiments, by obtaining the input signal used for parameter estimation by tapping off the power amplifier output used as the antenna signal. Thus, air link associated noise, which would otherwise be an additional error source impacting calibration, does not degrade the parameter estimation. Parameter estimation module 2208 looks at the signal from the receiver chain 2206 and estimates one or more parameters, e.g., parameters which are utilized by correction computation module 2210. In various embodiments, null pilot signals are advantageously utilized. For example, in an exemplary OFDM wireless communications systems, null pilot tone signals, are intentionally placed on some predetermined tone-symbols in a recurring channel structure. If zero is not observed on a null pilot measurement, the observed value may be attributed to some sort of calibration error. The value of the measured signal, where a null was expected can be advantageously used in estimating modeling parameters.

Consider that correction computation module 2210 is module 702 of FIG. 7, the parameter estimation of module 2208 may be, and sometimes is, used to update the processing of module 709, e.g., updating a parameter look up table, storing a new parameter look-up table, adjusting parameters in a mapping function, etc. Thus parameter estimation module 2208 facilitates dynamic recalibration of correction computation module 2210. Thus the correction computation module 2210 can be adjusted to more accurately reflect a power amplifier's current characteristics. In various embodiments, the updating to the correction computation module 2210, performed by parameter estimation module 2208, is performed at a slower rate than the corrections, e.g., corrections to feedback and state values, are communicated to the complex delta-sigma modulator module by the correction computation module 2210 and/or used by the delta-sigma modulator 2202.

8 Analysis and Form of Compensation

In this section we present some analysis of current dependent correction expected from switching amplifier circuits.

Figure 23:
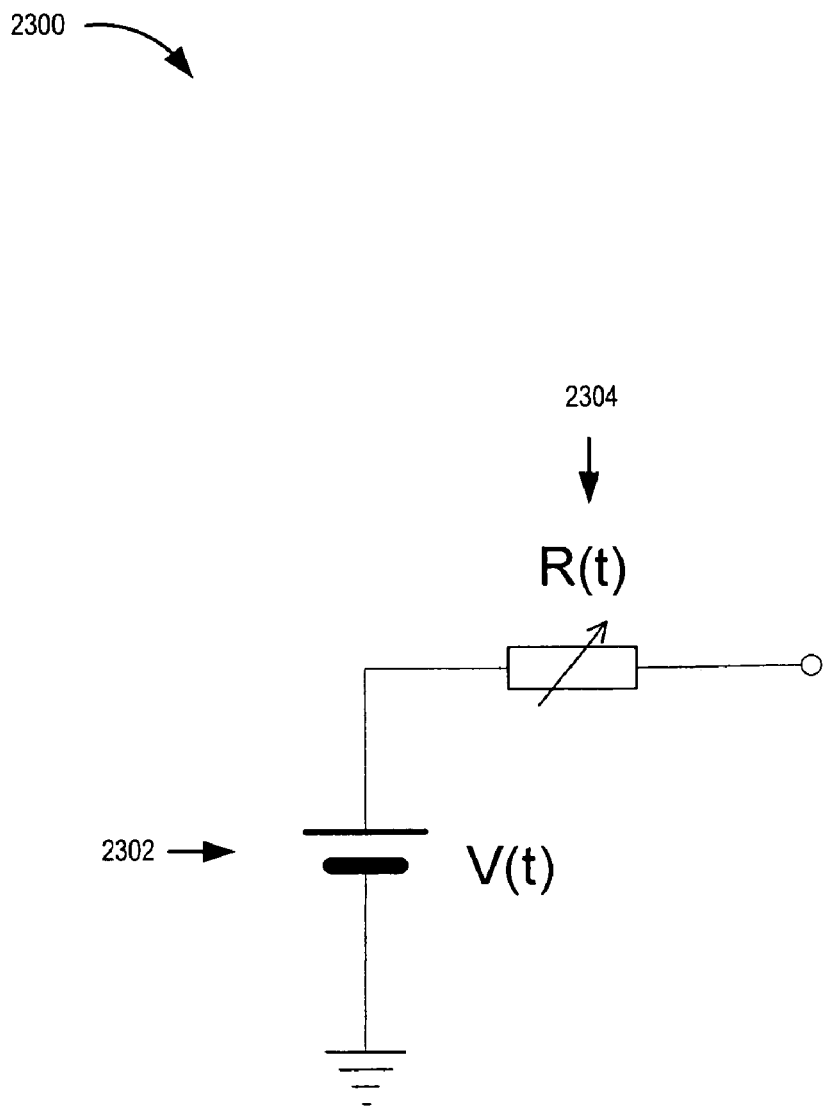
FIG. 23 is a drawing illustrating an exemplary time varying Thevenin equivalen circuit.

Let us first consider modeling the circuit using a time varying Thevenin equivalent circuit 2300, see FIG. 23. Exemplary time varying Thevenin equivalent circuit 2300 includes a time varying voltage V(t) 2302 in series with a resistance R(t) 2304.

Drawing 2400 shows an exemplary drawing including a time-varying voltage V(t) 2402, a resistance R(t) 2404, a filter 2406 and a load 2408 connected in series. For simplicity at this point let us assume that the circuit has a representation using the Thevenin equivalent as a time-varying voltage V(t) 2302 and resistance R(t) 2304. This is expected to be valid for e.g., FET transistors operating in the triode region. Let us also assume that the filter 2406 is an ideal band-pass filter: constant gain in the passband with no delay.

Let us consider the impact of R(t) during a single clock cycle. Let $I_W(t)$ be the indicator function of that cycle. We are interested in the function $$(I_w(t)R(t))I_R(t)$$

where $I_R(t)$ denotes the instantaneous current entering the filter. Over the support of $I_W(t)$ the current is proportional to real ($ue^{j\omega_c t}$) with, possibly a phase shift that we will ignore. Here u is the input signal or a suitably filtered version at that point in time and represents the envelope of the current passing through the filter and load. Extending this function over all time (for convenience) the Fourier transform is given by, $$F(I_R) = u\delta_\omega + u\delta_{-\omega}$$

In general, $F(I_W R)$ is a relatively complex object. We are interested, for purposes of discussion, in its contribution to the pass-band. Since the time support of $I_W R$ is very short, the Fourier transform is relatively smooth. We shall approximate by treating the value of the transform as a constant over any interval of size equal to the pass-band. Then, in the pass band (for $\omega \omega_c$) we see that $$F(I_W R I_R)(\omega) \approx F(I_W R)(0)x + F(I_W R)(2\omega_c)x^* := \alpha u + \beta u^*.$$

Figure 24:
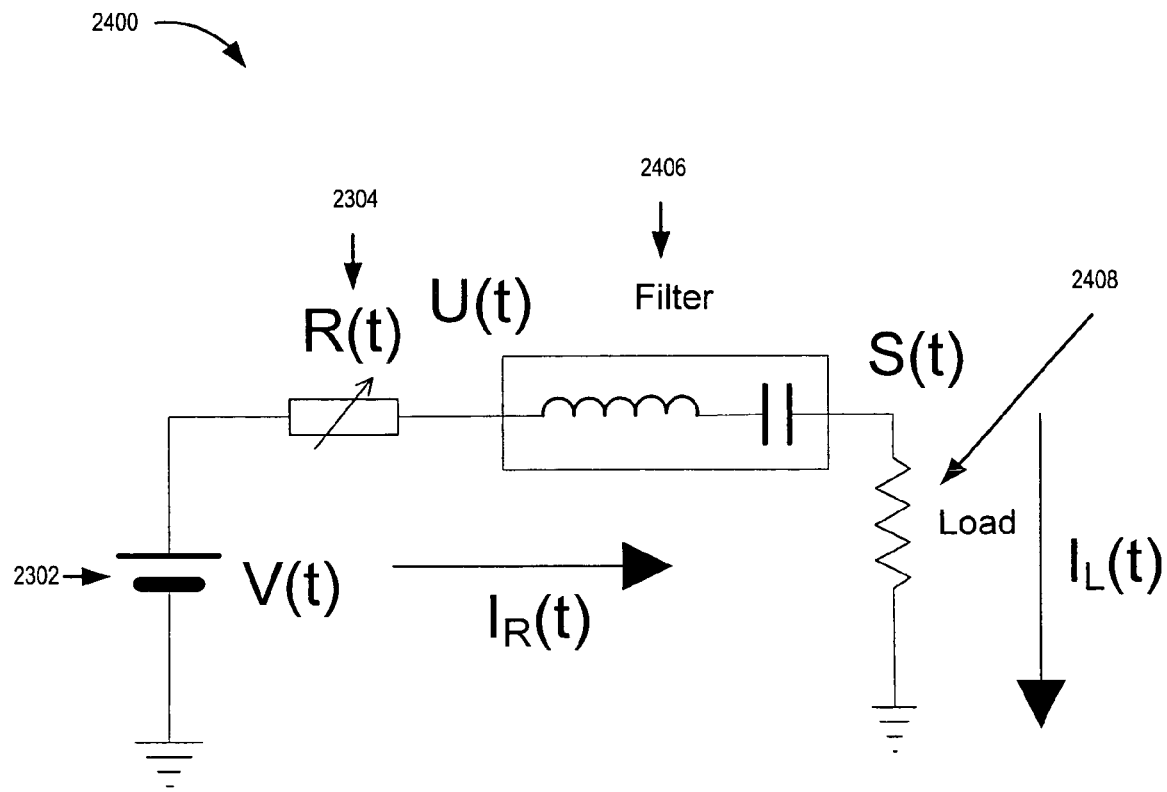
FIG. 24 is a drawing of an exemplary time varying Thevenin equivalent circuit, filter and load in accordance with various embodiments.

Note that the possible phase shift in the current, ignored above, can be incorporated into the complex constants $\alpha$ and $\beta$. In the Fourier domain, the disturbance signal caused by $I_W R(t)$ is essentially constant across the band of interest. Thus, we are lead to the important observation: The effect transient impedance can be modeled with an equivalent complex impulse. The height of the impulse is proportional to the current signal but also depends on the phase. See drawing 2400 of FIG. 24.

Consideration of FET transistor behavior (transient operation in non-triode regions) indicate that besides the above correction it may also be useful to use a correction which is quadratic in x. Constant terms also appear due to offsets etc. in voltages and devices, although many of the frequency shifting $\Delta\Sigma$ schemes obviate or minimize the use of such terms. Thus, the correction will typically have the form $$\gamma_1 + \alpha u + \beta u^* + \gamma_2 u_{re}^2 + \gamma_3 u_{im}^2 + \gamma_4 u_{im} u_{re} + \ldots$$

where $\gamma_i$ are complex parameters, with higher order terms being introduced if desired. The complex coefficients may be learned or identified for each device and for each distinct transient case. They might also vary slowly over time. They capture the relevant imperfections in the devices and their effects on the delivered signal. In the most general case one might conceive of an arbitrary complex function of current for a correction term. The function could be identified and tabulated at many points in the complex plane and otherwise evaluated using interpolation.

The value of R(t) discussed above, as well as other disturbances, can be expected to depend on the transitions that have been made in the driving circuit. The effects will decay in time, but perhaps not within one clock cycle. In such a case, some memory of previous transitions is used to characterize the disturbance.

Once a correction $e_t$ is computed it should be incorporated into the state of the $\Delta\Sigma$. Where the term $V_t$ appears in the current state it should effectively be replaced by $V_t + e_t$. In the case of striding $\Delta\Sigma$, for example, a correction term may arise for each step strided over, the combined effect would be incorporated into the state. In many cases the corrections for sequences produced by striding $\Delta\Sigma$ could be pre-computed and stored. Updating of the stored values maybe be limited to when the parameters associated to corrections had changed significantly.

EXEMPLARY EMBODIMENTS

As discussed above, the methods and apparatus of the invention are not limited to RF applications. Various audio amplifier features and embodiments will now be discussed. Audio amplifiers should faithfully reproduce signals in the range of 20 Hz to 20,000 Hz covering a range that includes a factor of 1000. A frequency shifting $\Delta\Sigma$, used in various RF embodiments described above, is not used in some audio applications. However, the basic ideas of correcting and calibrating for non-ideal behavior of the amplifier in the context where a $\Delta\Sigma$ modulator discussed above in the context of RF applications still apply and are used in various audio embodiments.

One advantage of the audio amplification case, which is a lower frequency setting than the RF case, is that the absolute peak in frequency is relatively low compared to digital speeds at which may currently available digital circuits can operate. Thus, significant processing and sophisticated modeling of the correction are possible.

Assuming that the transient switching impedance is purely resistive, we observe that an important quantity to know is the current entering the filter. In general, properties of the instantaneous current are may be relevant to the correction. At audio frequencies it is possible to simply measure the current on a fast time scale and use this value directly to compute the correction term. This is done in some but not necessarily all embodiments.

Provided the current measurement is sufficiently accurate, which it is in some embodiments, and sampled quickly enough, e.g., at a multiple 2, 4, 8 or more times the highest audio frequency signal being amplified, we could even correct for subtle components of the transient disturbance by allowing use of more complex correction models, such as ARMA models. This is done in some, but not necessarily all audio embodiments of the present invention.

Figure 25:
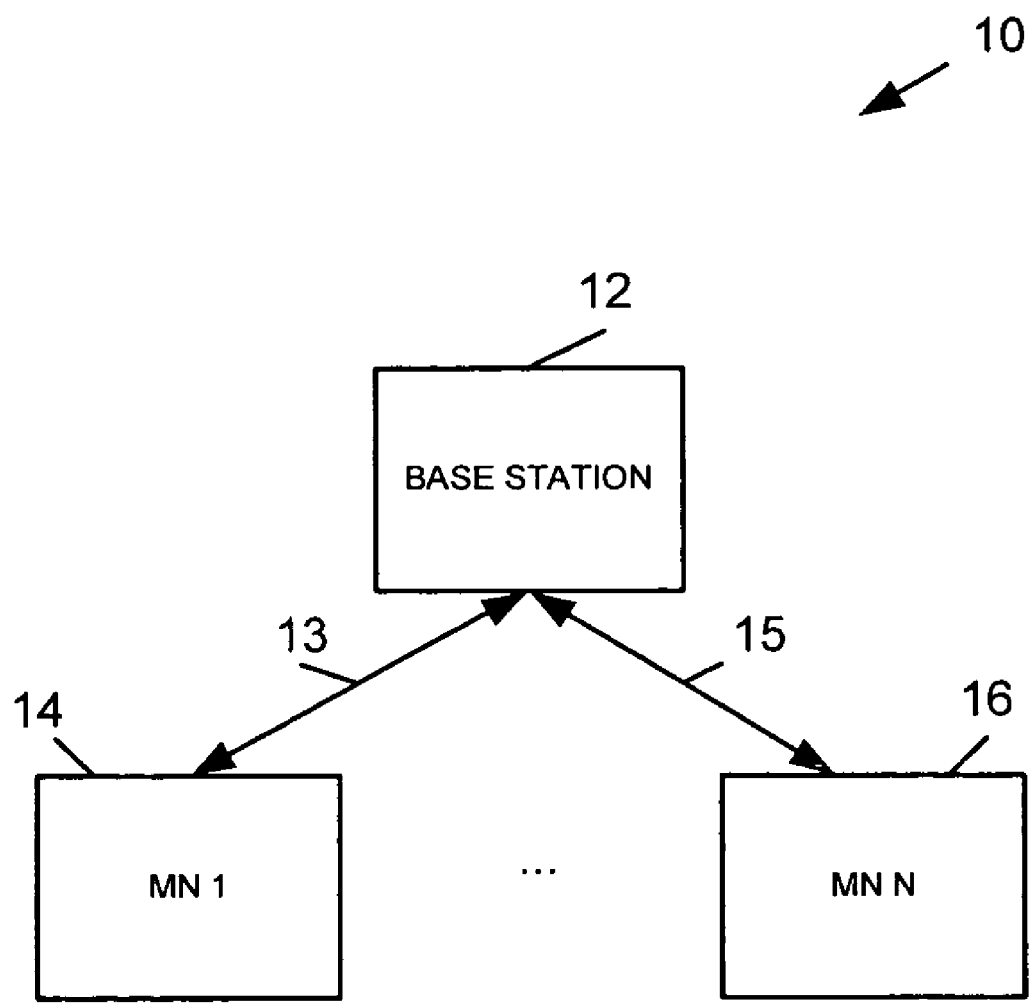
FIG. 25 is a drawing of an exemplary wireless communications system, e.g., OFDM wireless communications system, in accordance with various embodiments.

FIG. 25 illustrates a communications system 10 implemented in accordance with the invention. In the system 10, multiple wireless terminals, e.g., mobile nodes such as mobile terminals, shown as mobile nodes MN 1 (14) through MN N (16) communicate with the base station 12 through the use of communication signals 13, 15. Each mobile node may correspond to a different mobile user and are therefore sometimes referred to as user terminals. The signals 13, 15 may be, e.g., OFDM signals. The base station 12 and mobile nodes 14, 15 each implement the method of the present invention. Thus, signals 13, 15 include signals of the type discussed above, which are transmitted in accordance with the invention. Various embodiments include a plurality of base stations coupled together via a backhaul network.

Figure 26:
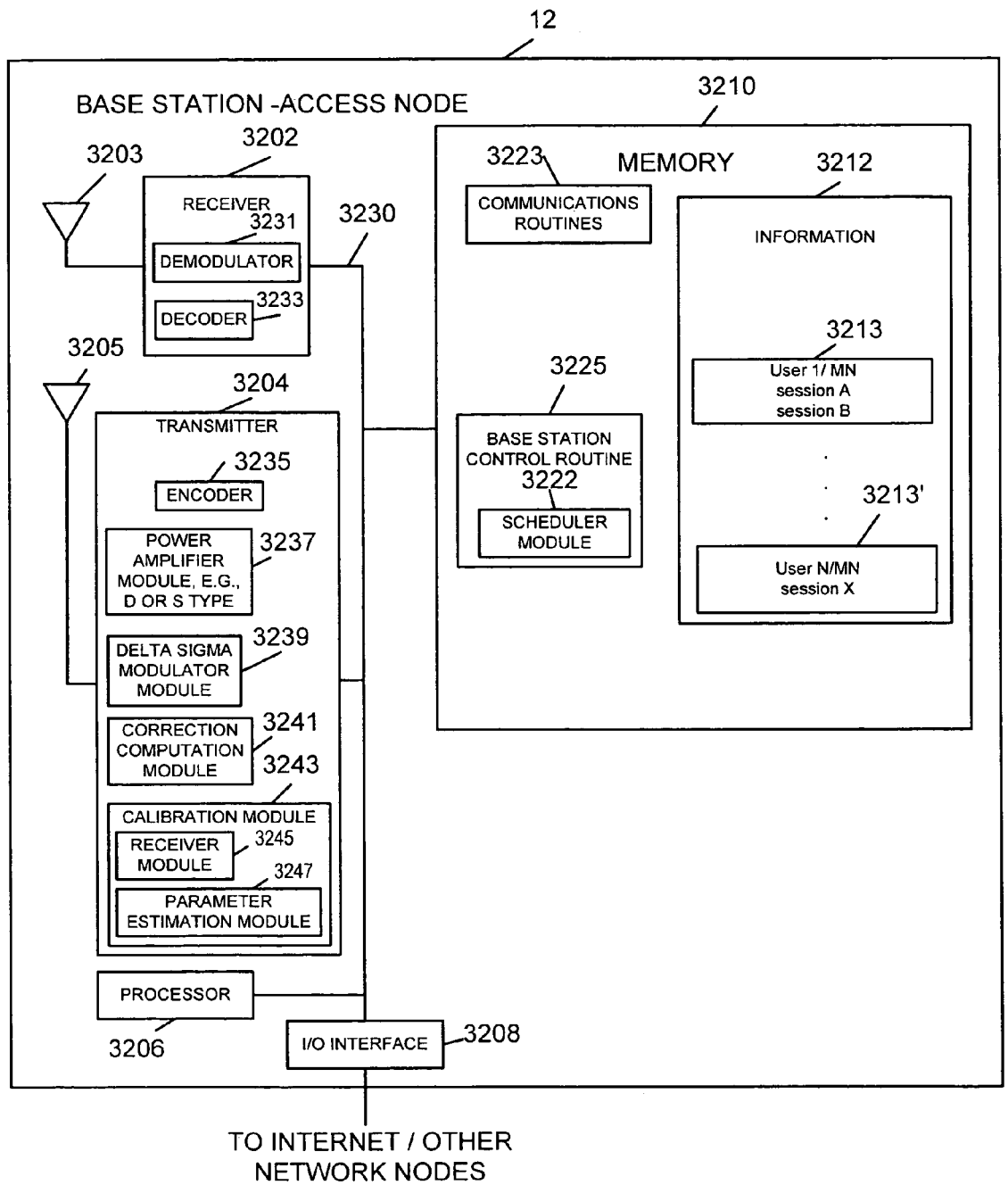
FIG. 26 is a drawing of an exemplary base station in accordance with various embodiments.

FIG. 26 illustrates an exemplary base station, e.g., access node 12, implemented in accordance with the invention. Base station 12 may also be referred to as an access router. The base station 12 includes antennas 3203, 3205 and receiver and transmitter modules 3202, 3204, respectively. The receiver module 3202 includes a demodulator 3231 and decoder 3233 while the transmitter module 3204 includes an encoder 3235. The transmitter also includes a power amplifier module 3237, e.g. a D or S type switching power amplifier module, a Delta-Sigma modulator module 3239, a correction computation module 3241, and a calibration module 3243. The calibration module 3243 includes, in some embodiments, a receiver module 3245 and a parimeter estimation module 3247. The correction computation module 3241 may be the same as or similar to the correction computation module 2210 of FIG. 22. In addition, the calibration module 3243 may be the same as or similar to the calibration module 2201 shown in FIG. 22. The components of the transmitter may be coupled together as shown in FIG. 22 with an output of the encoder 3235 suppling an input signal to the delta sigma modulator module 3239. The receiver 3202 and transmitter 3204 are coupled by a bus 3230 to an I/O interface 3208, processor (e.g., CPU) 3206 and memory 3210. The I/O interface 3208 couples the base station 312 to the Internet and/or to other network nodes. The memory 3210 includes routines, which when executed by the processor 3206, cause the base station 12 to operate in accordance with the invention. Memory includes communications routines 3223 used for controlling the base station 12 to perform various communications operations and implement various communications protocols. The memory 3210 also includes a base station control routine 3225 used to control the base station 12 to implement the steps of the method of the present invention. The base station control routine 3225 includes a scheduling module 3226 used to control transmission scheduling and/or communication resource allocation. Thus, module 3226 may serve as a scheduler. Memory 3210 also includes information used by communications routines 3223, and control routine 3225. The information 3212 includes an entry for each active mobile station user 3213, 3213' which lists the active sessions being conducted by the user and includes information identifying the mobile station (MT) being used by a user to conduct the sessions.

Servers and/or host devices may be implemented using circuitry which is the same as, or similar to, the circuitry of the exemplary access router shown in FIG. 26 but with interfaces and/or control routines suited to the particular server/host device's requirements. The control routines and/or hardware in such servers and/or hosts cause the devices to implement the above described methods.

Figure 27:
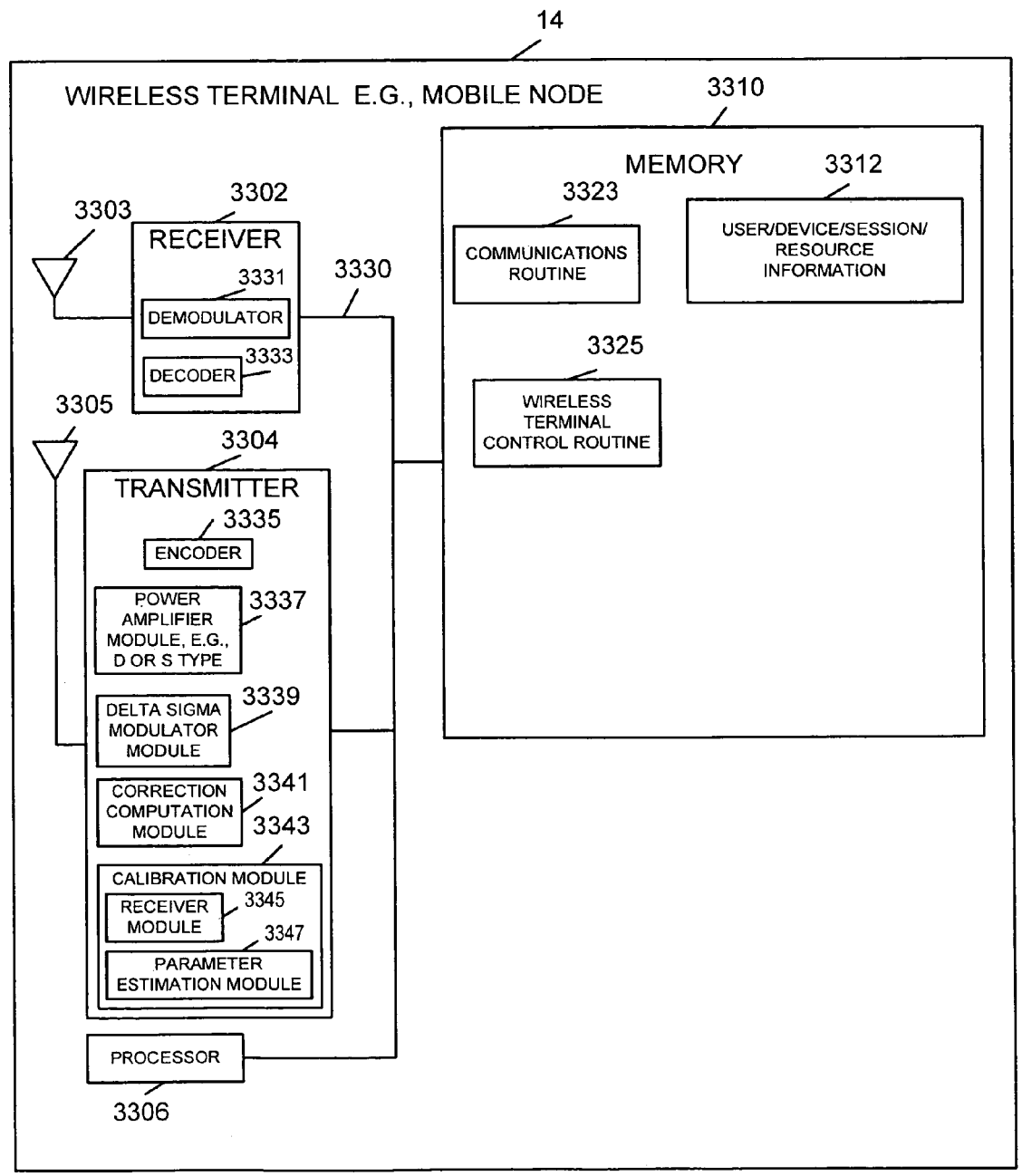
FIG. 27 is a drawing of an exemplary wireless terminal, e.g., mobile node, in accordance with various embodiments.

FIG. 27 illustrates an exemplary wireless terminal, e.g., a mobile node, 14 implemented in accordance with the present invention. The mobile node 14 may be used as a mobile terminal (MT). The mobile node 14 includes receiver and transmitter antennas 3303, 3305 which are coupled to receiver and transmitter modules 3302, 3304, respectively. The receiver module 3302 includes a demodulator 3331 and decoder 3333 while the transmitter module 3304 includes an encoder 3335. In some embodiments, transmitter 3304 may also include modules which are the same as or similar to power amplifier module 3237, delta sigma modulator module 3239, correction module 3241, and/or calibration module 243. In the illustrated embodiment, the transmitter module 3304 includes an encoder 3235, power amplifer module 3337, delta sigma modulator module 3339, correction computation module 3341 and a calibration module 3343. The calibration module 3343 includes a receiver module 3345 which may include a demodulator and a parameter estimation module 3347 used for generating correction parameters. The correction computation module may be the same as or similar to correction computation module 2210 while the calibration module 3343 may be the same as or similar to the calibration module 2201 shown in FIG. 22. The receiver and transmitter modules 3302, 3304 are coupled by a bus 3330 to a memory 3310. Processor 3306, under control of one or more routines stored in memory 3310 causes the mobile node to operate in accordance with the methods of the present invention. In order to control mobile node operation memory includes communications routine 3323, and wireless terminal control routine 3325. The wireless terminal control routine 3325 is responsible for insuring that the mobile node operates in accordance with the methods of the present invention and performs the steps to implement methods of the present invention. The memory 3310 also includes user/device/session/resource information 3312 which may be accessed and used to implement the methods of the present invention and/or data structures used to implement the invention.

Figure 28:
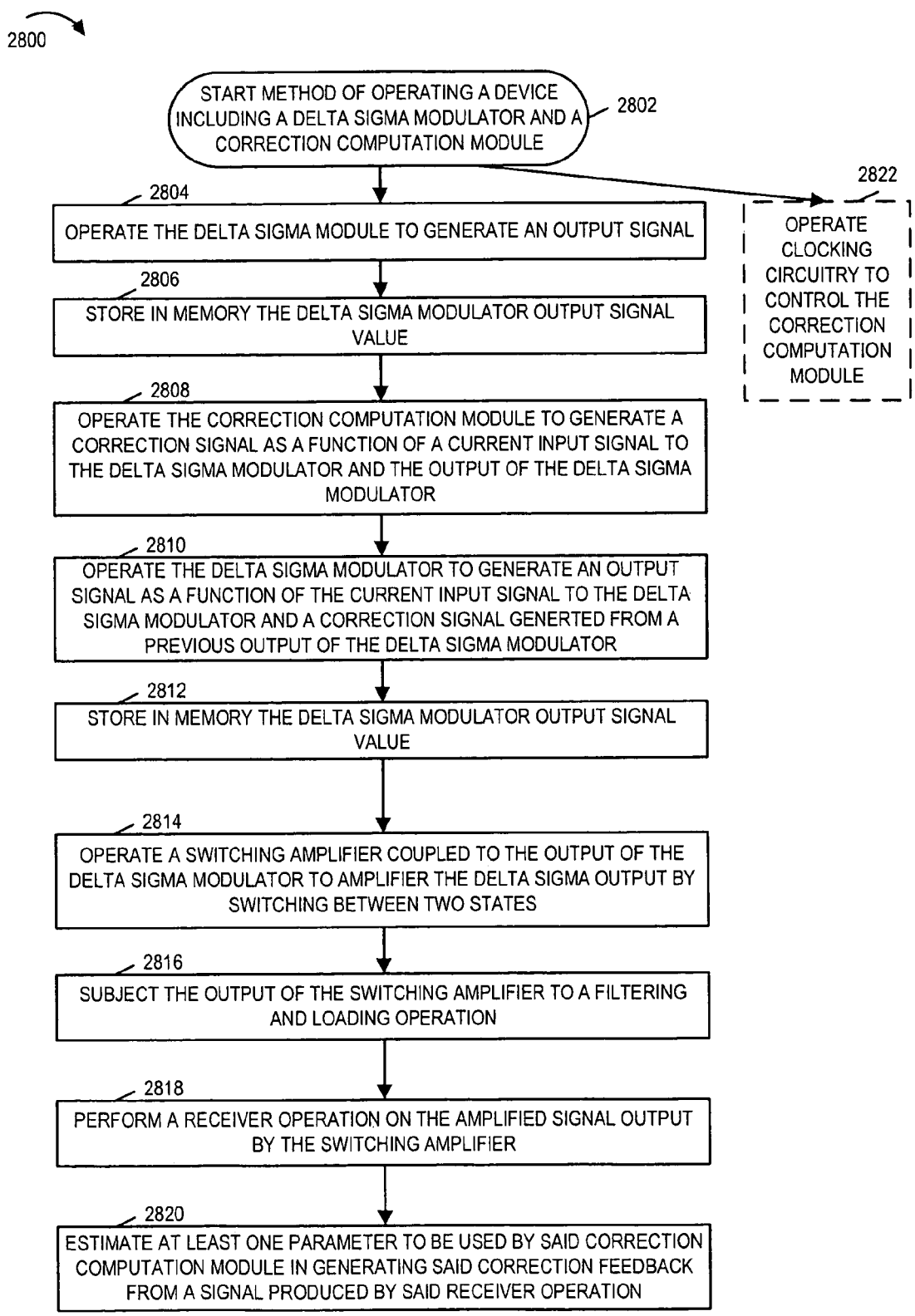
FIG. 28 is a drawing of a flowchart of an exemplary method of operating a device including a delta sigma modulator and a correction computation module in accordance with various embodiments.

FIG. 28 is a drawing of a flowchart 2800 of an exemplary method of operating a device including a delta sigma modulator and a correction computation module in accordance with various embodiments. The exemplary method may be used in amplifying signals through the use of a delta sigma modulator which supports a plurality of discrete signal output levels and a correction computation module. For example, the exemplary method is, in some embodiments, used in a communications device such as a base station or wireless terminal, the communications device including a delta sigma modulator, a correction computation module for determining corrections to be applied to the delta-sigma modulator, and a switching amplifier stage.

Operation starts in step 2802, where the device is powered on and initialized. Operation proceeds from start step 2802 to step 2804. In step 2804, the device operates the delta sigma modulator to generate an output signal. Operation proceeds from step 2804 to step 2806. In step 2806, the device stores in memory the delta sigma modulator output signal value. The stored delta sigma modulation output signal value from step 2806 can be used subsequently in generating a correction signal. Operation proceeds from step 2806 to step 2808.

In step 2808 the correction computation module is operated to generate a correction signal as a function of a current input signal to the delta sigma modulator and the output of the delta sigma modulator. In some embodiments, generating said correction signal includes computing delta sigma modulation correction feedback from an estimate of a current envelope of a current entering a filter and load module. In some such embodiments, said estimate of a current is a linear function of the complex input to said delta sigma modulator. In some such embodiments, the method further comprises the step of supplying the estimate of a current as an input to the delta sigma modulator.

Operation proceeds from step 2808 to step 2810. In step 2810, the delta sigma module is operated to generate an output signal as a function of the current input signal to the delta sigma modulator and a correction signal generated from a previous output of the delta sigma modulator.

In some embodiments, the delta sigma modulator is complex and the correction signal is complex. In some such embodiments, generating a correction signal includes generating a real correction signal component as a function of both a real input signal component and an imaginary input signal component of the complex input to the complex delta sigma modulator and generating an imaginary correction signal component as a function of both said real input signal component and said imaginary signal component of the complex input to the complex delta sigma modulator.

Operation proceeds from step 2810 to step 2812, where the device stores in memory the delta sigma modulator output signal value from step 2810. The stored delta sigma modulation output signal value from step 2812 can be used subsequently in generating correction signals.

Operation proceeds from step 2812 to step 2814. In step 2814, the device operates a switching amplifier coupled to the output of the delta sigma modulator to amplify the delta sigma output by switching between two states. Operation proceeds from step 2814 to step 2816. In step 2816, the output of the switching amplifier is subjected to a filtering and loading operation. In some embodiments, subjecting the output of said switching amplifier to a filtering and loading operation includes passing the output of said switching amplifier through a filter and load module which includes a filter and load coupled together. In some embodiments, the filtering and loading operation includes performing a bandpass filtering operation.

Operation proceeds from step 2816 to step 2818. In step 2818, the device performs a receiver operation on the amplified signal output by the switching amplifier, and then in step 2820, the device estimates at least one parameter, to be used by said correction computation module in generating correction feedback, from a signal produced by said receiver operation.

In some embodiments, operation proceeds from step 2802 to step 2822. In step 2822, the device operates clocking circuitry to control the correction computation module. In some such embodiments, operating the clocking circuitry to control the correction computation module includes controlling the correction module to produce a complex correction value at the same rate as an update rate of the delta sigma modulator.

The techniques of the present invention may be implemented using software, hardware and/or a combination of software and hardware. The present invention is directed to apparatus, e.g., mobile nodes such as mobile terminals, base stations, communications system which implement the present invention. It is also directed to methods, e.g., method of controlling and/or operating mobile nodes, base stations and/or communications systems, e.g., hosts, in accordance with the present invention. The present invention is also directed to machine readable medium, e.g., ROM, RAM, CDs, hard discs, etc., which include machine readable instructions for controlling a machine to implement one or more steps in accordance with the present invention.

In various embodiments nodes described herein are implemented using one or more modules to perform the steps corresponding to one or more methods of the present invention, for example, signal processing, symbol generation, transmission steps, calibration, signal modeling, error measurement, correction computations, correction adjustments, state updating, delta sigma modulator control, and/or power amplifier control, etc. Thus, in some embodiments various features of the present invention are implemented using modules. Such modules may be implemented using software, hardware or a combination of software and hardware. Many of the above described methods or method steps can be implemented using machine executable instructions, such as software, included in a machine readable medium such as a memory device, e.g., RAM, floppy disk, etc. to control a machine, e.g., general purpose computer with or without additional hardware, to implement all or portions of the above described methods, e.g., in one or more nodes. Accordingly, among other things, the present invention is directed to a machine-readable medium including machine executable instructions for causing a machine, e.g., processor and associated hardware, to perform one or more of the steps of the above-described method(s).

While described in the context of an OFDM system, at least some of the methods and apparatus of the present invention, are applicable to a wide range of communications systems including many non-OFDM and/or non-cellular systems. Some of the methods and apparatus of the present invention are applicable to various applications which use power amplifiers, e.g., including RF and audio applications.

Numerous additional variations on the methods and apparatus of the present invention described above will be apparent to those skilled in the art in view of the above description of the invention. Such variations are to be considered within the scope of the invention. The methods and apparatus of the present invention may be, and in various embodiments are, used with CDMA, orthogonal frequency division multiplexing (OFDM), and/or various other types of communications techniques which may be used to provide wireless communications links between access nodes and mobile nodes. In some embodiments the access nodes are implemented as base stations which establish communications links with mobile nodes using OFDM and/or CDMA. In various embodiments the mobile nodes are implemented as notebook computers, personal data assistants (PDAs), or other portable devices including receiver/transmitter circuits and logic and/or routines, for implementing the methods of the present invention.

What is claimed is:

1. An apparatus for use in amplifying signals, the apparatus comprising:
    an electrical delta sigma modulator having a first input, a correction input and a multiple level signal output for outputting an electrical signal having a plurality of discrete output levels; and
    a correction computation module having a first signal input coupled to the first signal input of said delta sigma modulator and a second signal input coupled to the delta sigma modulator output for generating a delta sigma modulator correction signal which is supplied to said correction input of the delta sigma modulator;
    wherein the electrical delta sigma modulator is complex; and
    wherein the correction signal is complex.

2. The apparatus of claim 1,
    wherein the real and imaginary correction signal components each depend on both the real and imaginary signal input components of a complex input to the complex electrical delta sigma modulator.

3. The apparatus of claim 2, further comprising:
    a switching amplifier coupled to the output of said electrical delta sigma modulator, said switching amplifier switching between two states.

4. The apparatus of claim 3, further comprising:
    a switching amplifier coupled to the output of said electrical delta sigma modulator, said switching amplifier switching between two states
    a filter and load module coupled to the output of said switching amplifier, said filter and load module including a filter and a load electrically coupled together.

5. The apparatus of claim 4, wherein said filter is a bandpass filter which is coupled in series with said load.

6. The apparatus of claim 3, further comprising:
receiver means coupled to the switching amplifier for performing a receiver operation on a signal output by the power amplifier means.

7. An apparatus for use in amplifying signals, the apparatus comprising:
a delta sigma modulator having a first input, a correction input and a multiple level signal output for outputting a signal having a plurality of discrete output levels;
a correction computation module having a first signal input coupled to the first signal input of said delta sigma modulator and a second signal input coupled to the delta sigma modulator output for generating a delta sigma modulator correction signal which is supplied to said correction input of the delta sigma modulator;
a switching amplifier coupled to the output of said delta sigma modulator, said switching amplifier switching between two states;
a filter and load module coupled to the output of said switching amplifier, said filter and load module including a filter and a load electrically coupled together;
wherein the delta sigma modulator is complex;
wherein the correction signal is complex;
wherein the real and imaginary correction signal components each depend on both the real and imaginary signal input components of a complex input to the complex delta sigma modulator; and
wherein said load is between 10 and 60 ohms, the bandwidth of said filter is between 1 MHz and 30 MHz, and the output of a carrier center frequency of a signal applied across said load is in the RF range of 400-5000 MHz.

8. An apparatus for use in amplifying signals, the apparatus comprising:
a delta sigma modulator having a first input, a correction input and a multiple level signal output for outputting a signal having a plurality of discrete output levels;
a correction computation module having a first signal input coupled to the first signal input of said delta sigma modulator and a second signal input coupled to the delta sigma modulator output for generating a delta sigma modulator correction signal which is supplied to said correction input of the delta sigma modulator;
a switching amplifier coupled to the output of said delta sigma modulator, said switching amplifier switching between two states;
a filter and load module coupled to the output of said switching amplifier, said filter and load module including a filter and a load electrically coupled together;
wherein the delta sigma modulator is complex;
wherein the correction signal is complex;
wherein the real and imaginary correction signal components each depend on both the real and imaginary signal input components of a complex input to the complex delta sigma modulator;
wherein said filter is a bandpass filter which is coupled in series with said load; and
wherein said correction module includes a module for using an estimate of a current envelope of a current entering said filter and load module to produce said delta sigma modulator correction signal.

9. The apparatus of claim 8, wherein said estimate of a current is a linear function of the complex input to said delta sigma modulator.

10. The apparatus of claim 9, wherein said estimate of a current is one of the inputs to the delta sigma modulator.

11. The apparatus of claim 10,
wherein said delta sigma modulator correction feedback signal is a complex value; and
wherein the correction module further includes memory for storing at least one previous delta sigma modulator output signal.

12. The apparatus of claim 11, wherein the memory stores at least 2 previous output signal values.

13. The apparatus of claim 11, wherein the correction computation module further includes a correction computation element for generating the complex correction from the estimated current and said at least one stored signal value.

14. The apparatus of claim 13, further including clocking circuitry to control said correction module to produce a complex correction value at the same rate as the update rate of the delta sigma modulator.

15. An apparatus for use in amplifying signals, the apparatus comprising:
a complex delta sigma modulator having a first input, a correction input and a multiple level signal output for outputting a signal having a plurality of discrete output levels;
a complex correction computation module having a first signal input coupled to the first signal input of said complex delta sigma modulator and a second signal input coupled to the output of the delta sigma modulator for generating a complex delta sigma modulator correction signal which is supplied to said correction input of the delta sigma modulator; and
a switching amplifier coupled to the output of said complex delta sigma modulator, said switching amplifier switching between a plurality of states; and
a receiver module coupled to the output of the switching amplifier for performing a receiver operation on the signal output by the power.

16. The apparatus of claim 15, further comprising:
a parameter estimation module coupled to said receive module for estimating at least one parameter to be by used by said complex correction computation module in generating said correction signal.

17. A method for use in amplifying signals through the use of an electrical delta sigma modulator which supports a plurality of discrete signal output levels and a correction computation module, the method comprising:
operating the electrical delta sigma modulator to generate an electrical output signal as a function of a current input signal and a correction signal generated from a previous output of the delta signal modulator; and
operating the correction computation module to generate said correction signal as a function of the current input signal to the delta sigma modulator and the output of the delta sigma modulator;
wherein the delta sigma modulator is complex; and
wherein the correction signal is complex.

18. The method of claim 17,
wherein generating said correction signal includes generating a real correction signal component as a function of both a real input signal component and an imaginary input signal component of the complex input to the complex delta sigma modulator and generating an imaginary correction signal component as a function of both said real input signal component and said imaginary input signal component of the complex input to the complex delta sigma modulator.

19. The method of claim 18, further comprising:
operating a switching amplifier coupled to the output of said delta sigma modulator to amplify said delta sigma modulator output by switching between two states.

20. The method of claim 19, further comprising:
subjecting the output of said switching amplifier to a filtering and loading operation.

21. The method of claim 20, wherein subjecting the output of said switching amplifier to a filtering and loading operation includes passing the output of said switching amplifier through a filter and load module which includes a filter and a load electrically coupled together.

22. The method of claim 20, wherein said filtering and loading operation includes performing a bandpass filtering operation.

23. A method for use in amplifying signals through the use of a delta sigma modulator which supports a plurality of discrete signal output levels and a correction computation module, the method comprising:
operating the delta sigma modulator to generate an output signal as a function of a current input signal and a correction signal generated from a previous output of the delta sigma modulator; and
operating the correction computation module to generate said correction signal as a function of the current input signal to the delta sigma modulator and the output of the delta sigma modulator;
operating a switching amplifier coupled to the output of said delta sigma modulator to amplify said delta sigma modulator output by switching between two states;
subjecting the output of said switching amplifier to a filtering and loading operation;
wherein generating said correction signal includes generating a real correction signal component as a function of both a real input signal component and an imaginary input signal component of the complex input to the complex delta sigma modulator and generating an imaginary correction signal component as a function of both said real input signal component and said imaginary input signal component of the complex input to the complex delta sigma modulator;
wherein the delta sigma modulator is complex;
wherein the correction signal is complex;
wherein subjecting the output of said switching amplifier to a filtering and loading operation includes passing the output of said switching amplifier through a filter and load module which includes a filter and a load electrically coupled together; and
wherein generating said correction signal includes computing a correction feedback value to be communicated in said delta sigma modulator correction signal from an estimate of a current envelope of a current entering said filter and load module.

24. The method of claim 23, wherein said estimate of a current is a linear function of the complex input to said delta sigma modulator.

25. The method of claim 24, further comprising:
supplying said estimate of a current as an input to the delta sigma modulator.

26. The method of claim 25, further including:
storing in memory at least one previous delta sigma modulator output signal value to be used in generated said correction signal.

27. A method for use in amplifying signals through the use of a delta sigma modulator which supports a plurality of discrete signal output levels and a correction computation module, the method comprising:
operating the delta sigma modulator to generate an output signal as a function of a current input signal and a correction signal generated from a previous output of the delta sigma modulator;
operating the correction computation module to generate said correction signal as a function of the current input signal to the delta sigma modulator and the output of the delta sigma modulator; and
operating clocking circuitry to control said correction module to produce a complex correction value at the same rate as an update rate of the delta sigma modulator.

28. A method for use in amplifying signals through the use of a complex delta sigma modulator which supports a plurality of discrete signal output levels and a complex correction computation module, the method comprising:
operating the complex delta sigma modulator to generate a complex output signal as a function of a current input signal and a correction signal generated from a previous output of the complex delta sigma modulator;
operating the complex correction computation module to generate said correction signal as a function of the current input signal to the complex delta sigma modulator and the output of the complex delta sigma modulator;
operating a switching amplifier coupled to the output of said complex delta sigma modulator to amplify said complex delta sigma modulator output by switching between two states; and
performing a receiver operation on the amplified signal output by said switching amplifier.

29. The method of claim 28, further comprising:
estimating at least one parameter to be by used by said correction computation module in generating said correction feedback signal from a signal produced by said receiver operation.

30. An apparatus for use in amplifying signals, the apparatus comprising:
delta sigma modulator means for generating an output signal as a function of a current input signal and a correction signal generated from a previous output of the delta sigma modulator means; and
correction computation means for generating said correction signal as a function of the current input signal to the delta sigma modulator means and the output of the delta sigma modulator means
switching amplifier means coupled to the output of said delta sigma modulator means, said switching amplifier switching between two states;
filter and load module means coupled to the output of said switching amplifier means, said filter and load module means including filter means and a load electrically coupled to said filter means;
wherein the delta sigma modulator means is complex;
wherein the correction signal is complex;
wherein the real and imaginary correction signal components each depend on both the real and imaginary signal input components of a complex input to the complex delta sigma modulator means; and
wherein said load is between 10 and 60 ohms, the bandwidth of said filter is between 1 MHz and 30 MHz, and the output of a carrier center frequency of a signal applied across said load is in the RF range of 400-5000 MHz.

31. The apparatus of claim 30,
wherein the output of the delta sigma is an electrical signal.

32. The apparatus of claim 31, wherein the apparatus is a base station.

33. The apparatus of claim 31, wherein said apparatus is a wireless terminal.

34. An apparatus for use in amplifying signals, the apparatus comprising:
- delta sigma modulator means for generating an output signal as a function of a current input signal and a correction signal generated from a previous output of the delta sigma modulator means;
- correction computation means for generating said correction signal as a function of the current input signal to the delta sigma modulator means and the output of the delta sigma modulator means;
- switching amplifier means for amplifying a delta sigma modulator output by switching between two states;
- means for subjecting the output of said switching amplifier means to a filtering and loading operation;
- receiver means coupled to the power amplifier means for performing a receiver operation on a signal output by the power amplifier means;
- parameter estimation means for estimating, from an output of said receiver means, at least one parameter to be by used by said correction computation means in generating said correction signal;
- wherein the delta sigma modulator means is a complex delta sigma modulator; and
- wherein the correction signal is complex.

35. The apparatus of claim 34, further comprising:
- an additional receiver means for processing wireless signals received by said apparatus.

36. A computer readable medium embodying machine executable instructions for implementing a method of using a delta sigma modulator which supports a plurality of discrete signal output levels and a correction computation module, the method comprising:
- operating the delta sigma modulator to generate an output signal as a function of a current input signal and a correction signal generated from a previous output of the delta sigma modulator;
- operating the correction computation module to generate said correction signal as a function of the current input signal to the delta sigma modulator and the output of the delta sigma modulator;
- operating a switching amplifier coupled to the output of said delta sigma modulator to amplify said delta sigma modulator output by switching between two states;
- subjecting the output of said switching amplifier to a filtering and loading operation;
- wherein generating said correction signal includes generating a real correction signal component as a function of both a real input signal component and an imaginary input signal component of the complex input to the complex delta sigma modulator and generating an imaginary correction signal component as a function of both said real input signal component and said imaginary input signal component of the complex input to the complex delta sigma modulator;
- wherein the delta sigma modulator is complex;
- wherein the correction signal is complex;
- wherein subjecting the output of said switching amplifier to a filtering and loading operation includes passing the output of said switching amplifier through a filter and load module which includes a filter and a load electrically coupled together; and
- wherein generating said correction signal includes computing a correction feedback value to be communicated in said correction signal from an estimate of a current envelope of a current entering said filter and load module.

37. The computer readable medium of claim 36, wherein the delta sigma modulator output signal is an electrical signal.

38. The computer readable medium of claim 37, wherein said computer readable medium is part of a communications device.

39. An apparatus operable in a communication system, the apparatus comprising:
- a processor configured to:
  - operate a delta sigma modulator to generate an output signal as a function of a current input signal and a correction signal generated from a previous output of the delta sigma modulator; and
  - operate a computation module to generate said correction signal as a function of the current input signal to the delta sigma modulator and the output of the delta sigma modulator;
  - operate a switching amplifier coupled to the output of said delta sigma modulator to amplify said delta sigma modulator output by switching between two states;
  - subject the output of said switching amplifier to a filtering and loading operation;
- wherein operating a computation module to generate said correction signal includes controlling the computation module to generate a real correction signal component as a function of both a real input signal component and an imaginary input signal component of the complex input to the complex delta sigma modulator and generate an imaginary correction signal component as a function of both said real input signal component and said imaginary input signal component of the complex input to the complex delta sigma modulator;
- wherein the delta sigma modulator is complex;
- wherein the correction signal is complex;
- wherein subjecting the output of said switching amplifier to a filtering and loading operation includes passing the output of said switching amplifier through a filter and load module which includes a filter and a load electrically coupled together; and
- wherein generating said correction signal includes computing a correction feedback value to be communicated in said correction signal from an estimate of a current envelope of a current entering said filter and load module.

40. The apparatus of claim 39, wherein the delta sigma modulator generates a complex electrical output signal.

41. The apparatus of claim 40, wherein said apparatus is a wireless terminal.

42. A communications device, comprising:
- a complex delta sigma modulator having a first input, a correction input and a multiple level signal output for outputting a complex signal having a plurality of discrete output levels;
- a complex correction computation module having a first signal input coupled to the first signal input of said complex delta sigma modulator and a second signal input coupled to the output of said complex delta sigma modulator for generating a complex delta sigma modulator correction feedback signal which is supplied to said correction input of the delta sigma modulator;
- a switching type amplifier coupled to the output of the complex delta sigma modulator; and an antenna coupled to an output of the switching type amplifier.

43. A communications device, comprising:

a complex delta sigma modulator having a first input, a correction input and a multiple level signal output for outputting a signal having a plurality of discrete output levels;

a complex correction computation module having a first signal input coupled to the first signal input of said delta sigma modulator and a second signal input coupled to the output of the delta sigma modulator for generating a complex delta sigma modulator correction feedback signal which is supplied to said correction input of the complex delta sigma modulator;

a switching type amplifier coupled to the output of the complex delta sigma modulator; and an antenna coupled to the switching type amplifier output;

a receiver coupled to the switching type amplifier output; and a parameter estimation module for determining a parameter from a demodulated signal generated by said receiver, said parameter being used by said correction computation module in generating said correction feedback signal.

44. The communications device of claim 43, wherein said communications device is a base station; and wherein said communications device include an additional receiver for receiving uplink signals.

45. The communications device of claim 44, wherein each of said receiver and said additional receiver include a demodulator.

46. The communications device of claim 45, wherein said communications device is a wireless terminal; and wherein said communications device further includes an additional receiver for receiving downlink signals.

47. The communications device of claim 46, wherein each of said receiver and said additional receiver include a demodulator.

* * * * *